(12) United States Patent
Kim et al.

(10) Patent No.: US 8,159,056 B1
(45) Date of Patent: Apr. 17, 2012

(54) PACKAGE FOR AN ELECTRONIC DEVICE

(75) Inventors: Sangchae Kim, Huntersville, NC (US); Steven Crist, Charlotte, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 1129 days.

(21) Appl. No.: 12/014,665

(22) Filed: Jan. 15, 2008

(51) Int. Cl.
*H01L 23/02* (2006.01)

(52) U.S. Cl. ..... 257/678; 257/416; 257/682; 310/313 R; 333/193; 438/106; 438/456; 216/2; 216/58; 216/83

(58) Field of Classification Search ............. 216/2, 58, 216/83; 438/106, 456; 310/313 R; 333/193; 257/416, 678
See application file for complete search history.

(56) References Cited

U.S. PATENT DOCUMENTS

| | | | |
|---|---|---|---|
| 5,188,983 A * | 2/1993 | Guckel et al. | 438/53 |
| 5,458,847 A | 10/1995 | Hu | |
| 6,146,700 A | 11/2000 | Yuan et al. | |
| 6,146,917 A * | 11/2000 | Zhang et al. | 438/51 |
| 6,346,030 B1 | 2/2002 | Morales | |
| 6,445,069 B1 | 9/2002 | Ling et al. | |
| 6,511,859 B1 | 1/2003 | Jiang et al. | |
| 6,650,205 B2 | 11/2003 | Goetz et al. | |
| 6,744,336 B1 | 6/2004 | Goetz et al. | |
| 6,846,423 B1 | 1/2005 | Miller et al. | |
| 6,877,209 B1 | 4/2005 | Miller et al. | |
| 7,008,812 B1 | 3/2006 | Carley | |
| 7,381,583 B1 | 6/2008 | Ebel et al. | |
| 7,659,150 B1 | 2/2010 | Monadgemi et al. | |
| 2004/0125970 A1 | 7/2004 | Kawakubo | |
| 2004/0137728 A1 | 7/2004 | Gallagher et al. | |
| 2004/0248344 A1 | 12/2004 | Partridge et al. | |
| 2005/0214974 A1 | 9/2005 | Field et al. | |
| 2005/0250253 A1 * | 11/2005 | Cheung | 438/125 |
| 2006/0033189 A1 | 2/2006 | Haba et al. | |
| 2006/0139121 A1 | 6/2006 | Jhung | |
| 2007/0013268 A1 | 1/2007 | Kubo et al. | |
| 2007/0209176 A1 | 9/2007 | Kawakubo et al. | |
| 2007/0218585 A1 * | 9/2007 | Robert | 438/106 |
| 2008/0049386 A1 * | 2/2008 | Pornin et al. | 361/679 |

OTHER PUBLICATIONS

U.S. Appl. No. 11/434,952, filed May 16, 2006, Final Rejection mailed Aug. 20, 2008.
U.S. Appl. No. 11/434,952, filed May 16, 2006, Non-Final Rejection mailed Apr. 3, 2008.
U.S. Appl. No. 11/434,952, filed May 16, 2006, Requirement for Restriction/Election mailed Feb. 21, 2008.
U.S. Appl. No. 12/035,258, filed Feb. 21, 2008, Non-Final Rejection mailed Sep. 5, 2008.
U.S. Appl. No. 12/108,124, filed Apr. 23, 2008, Non-Final Rejection mailed Sep. 21, 2010.
U.S. Appl. No. 12/108,124, filed Apr. 23, 2008, Requirement for Restriction/Election mailed Jun. 23, 2010.

(Continued)

*Primary Examiner* — Shamim Ahmed
(74) *Attorney, Agent, or Firm* — Withrow & Terranova, P.L.L.C.

(57) ABSTRACT

A method of forming a device is provided. A substrate having a component is provided and a sacrificial layer is formed over the component. The sacrificial layer includes a cavity portion disposed about the component and a tunnel portion adjacent to the cavity portion. In addition, an encapsulation layer having a cover portion and a perimeter portion is formed over the sacrificial layer. The cover portion encapsulates the cavity portion such that the cavity portion forms a cavity within the cover portion. The perimeter portion is disposed over the tunnel portion. Moreover, an access hole is formed in the perimeter portion of the encapsulation layer.

22 Claims, 22 Drawing Sheets

OTHER PUBLICATIONS

Ando et al., "New Packaging Technology for SAW Device," Electronic Manufacturing Technology Symposium, Dec. 1995, pp. 403-406.

Badihi, Avner, "A Wafer Level Chip Size Package for Micromechanical and Microlenses Applications," SMTA International, Sep. 2000, Chicago, IL.

Baldwin et al., "Modular, Device-Scale, Direct-Chip-Attach Packaging for Microsystems," SMTA International, Sep. 2002, Boston, MA.

Butler et al., "Adapting Multichip Module Foundries for MEMS Packaging," The International Journal of Microcircuits and Electronic Packaging, Second Quarter 1998, pp. 212-218, vol. 21, No. 2, International Microelectronics and Packaging Society.

Daeche et al., "Low Profile Packaging Solution for RF-MEMS Suitable for Mass Production," Proceedings of 2003 International Symposium on Microelectronics, 2003, pp. 412-416, International Society for Optical Engineering.

Franosch et al., "Wafer-Level-Package for Bulk Acoustic Wave (BAW) Filters," IEEE MTTS, Jun. 2004, pp. 493-496, IEEE, Fort Worth, TX.

King et al., "SAW Filters in CDMA Mobile Communication Networks," Conference Proceedings of Wireless Technologies China, 1999, pp. 104-107.

Klink et al., "Wafer Bonding with an Adhesive Coating," SPIE Conference on Micromachined Devices and Components IV, Sep. 1998, pp. 50-61, vol. 3514, SPIE, Santa Clara, CA.

Lebouitz et al., "Vacuum Encapsulation of Resonant Devices Using Permeable Polysilicon," IEEE MEMS, Jan. 1999, pp. 470-475, IEEE, Orlando, FL.

* cited by examiner

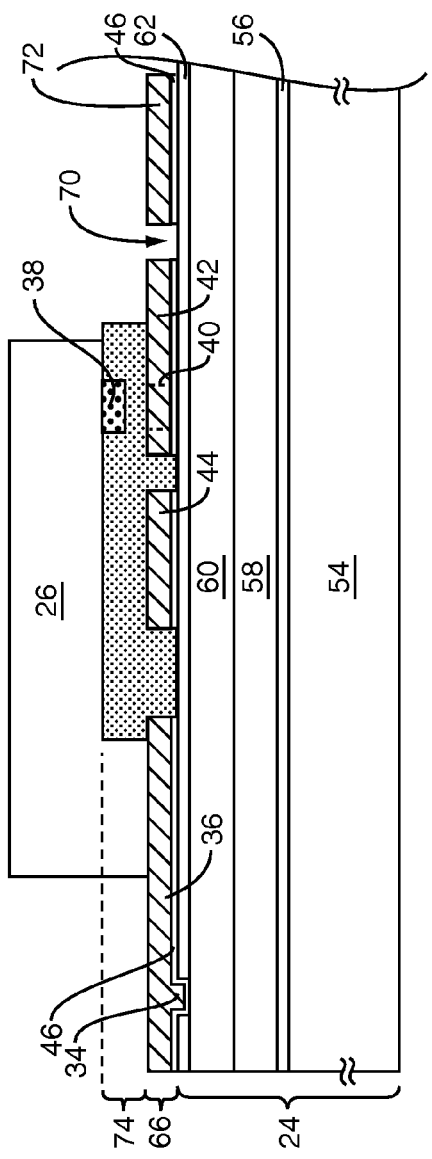
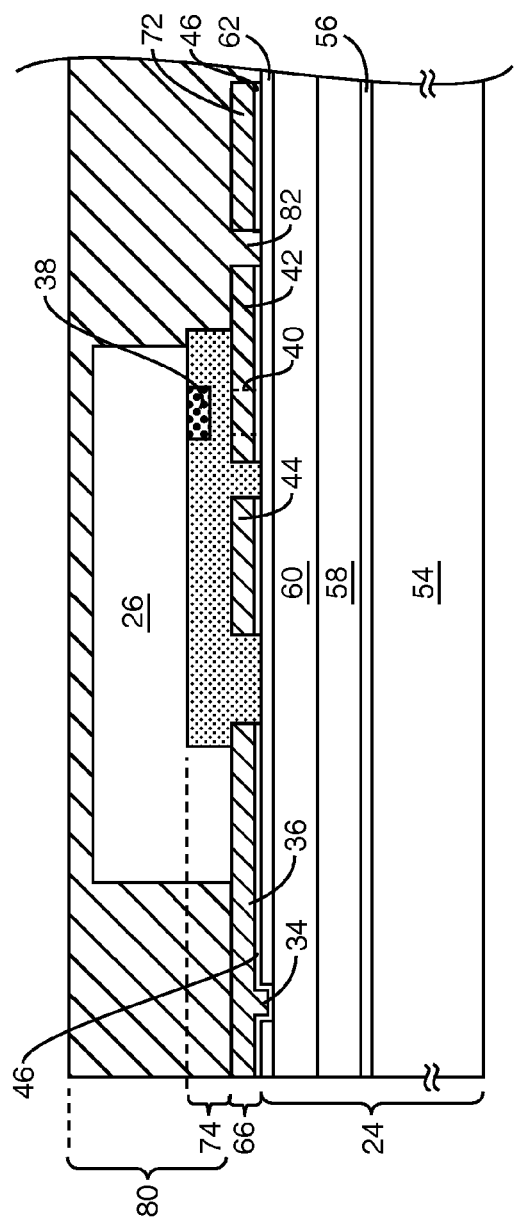
FIG. 9
FIG. 10

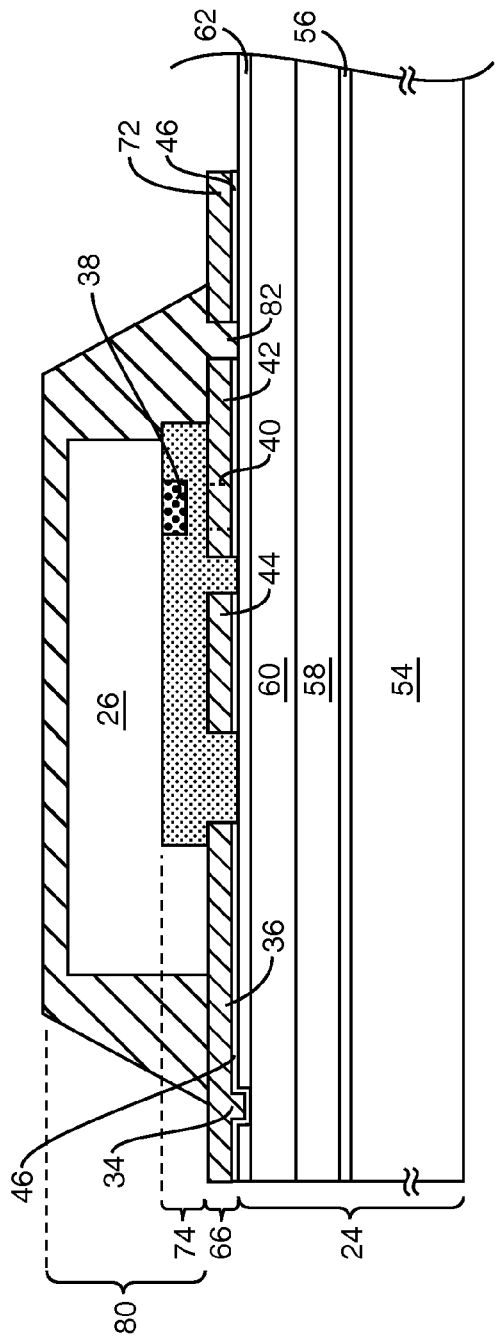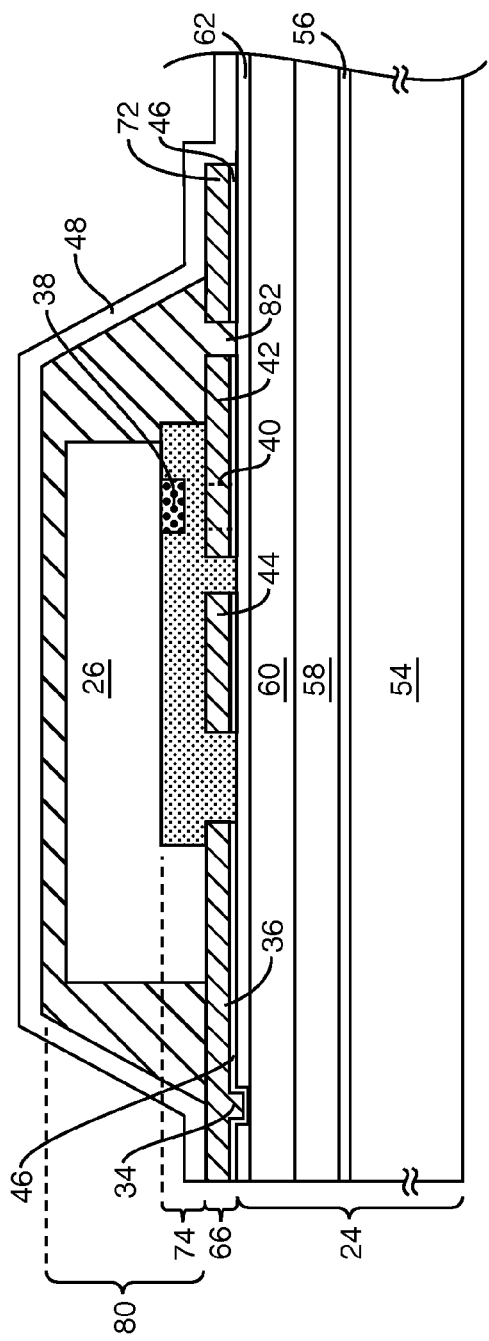

PACKAGE FOR AN ELECTRONIC DEVICE

FIELD OF THE INVENTION

The present invention generally relates to semiconductor devices, and more particularly to forming a package for a semiconductor device.

BACKGROUND OF THE INVENTION

Various types of active microelectronic components operate best in an open area cavity. Such active components include Surface Acoustic Wave (SAW) devices and Microelectromechanical Systems (MEMS) devices. These devices are very sensitive to moisture and particulates, which can cause device failure, alter performance, and decrease reliability. The traditional method of protecting these devices has been to encase the device in a ceramic package, a metal lid, or through wafer-to-wafer bonding that creates a hermetic cavity necessary for proper long-term performance. This approach is successful in protecting the device, but results in an increase in die area significantly above and beyond the active area footprint. In addition, ceramic packages are expensive and constitute a significant portion of the total cost of the entire packaged device. Furthermore, placing these devices within a ceramic package requires wafers to be shipped to a second facility for further processing before they are able to be finally tested and integrated, thereby greatly increasing the required manufacturing time. Many of these components play a significant role in circuits, which are primarily implemented in semiconductor modules.

In an effort to reduce fabrication cost, complexity, and cycle time, as well as the overall footprint of the microelectronic module, efforts have been made to create integrated hermetic cavities for active components at the wafer level. This would eliminate the need for the cost and time associated with the ceramic packaging process and would keep all of the operations in die processing from bare substrate to final testing at a single facility. In many instances, creation of the integrated hermetic cavity requires significant variations from the fabrication process used to form microelectronic devices without hermetic cavities. These variations add cost, complexity, and time to the fabrication process of the microelectronic device. One such proposal is provided in U.S. Pat. No. 6,877,209 to Miller, wherein a polysilicon material is used as a sacrificial layer, which is removed using Xenon Difluoride ($XeF_2$) to form a cavity. However, equipment that works with Xenon Difluoride is not commonly found in microelectronic fabrication facilities. As such, the use of Xenon Difluoride has proven to be costly and injects inefficiency into the fabrication process. In addition, polysilicon films are typically deposited by the use of Chemical Vapor Deposition equipment or by sputtering. These techniques have the disadvantage of requiring high temperatures or long deposition times, both of which are detrimental when applied to SAW filters or MEMS devices. The thickness uniformity of the resulting films is also historically poor with this type of equipment. Finally, the polysilicon films tend to be conformal to the underlying topography. Therefore, when polysilicon is used as a sacrificial layer, the underside of any subsequent films used as a cap layer will not be planar, leading to variations in the height of the cavity and potential issues for yield or reliability failures of finished die.

An issue with integrated cavities is that the cavities are prone to collapse due to high pressures associated with the fabrication process. An extra thick cap layer over the cavity is employed by Miller to increase structural integrity. However, providing a cap layer sufficiently thick to survive the fabrication process results in excessively long deposition times and an unduly thick package. As any film that is deposited must subsequently be etched through in order to provide access to bondpads and the associated circuitry of the device, unduly thick films will necessitate unduly long etch times, further increasing the length of the process. Additionally, the thickness and thickness variability of the films can cause issues with flip-chip processing, as mold compound that is injected inbetween adjacent flip-chip bumps or posts may not flow uniformly and repeatably, and the thickness of the dielectric might undesirably require that flip-chip bump and post height to be increased.

As such, there is a need for a cost efficient process to create a microelectronic device having an integrated, hermetic cavity to enclose active devices at the wafer level.

SUMMARY OF THE INVENTION

According to the present invention, a component is formed on a substrate. Initially, a substrate is provided with a component mounted thereon. The device is encapsulated by at least one sacrificial cavity material, which is covered by at least one encapsulation layer. The sacrificial cavity material is shaped in the form of a cavity. The cavity will be formed about the device once the sacrificial cavity material is removed. A portion of the encapsulation layer that encapsulates the sacrificial cavity material and the device therein is referred to as a cover portion, which is used to form a cover structure, such as a dome. A portion of the encapsulation layer that resides over the substrate and about the perimeter of the cover portion is referred to as a perimeter portion. Notably, a sacrificial tunnel material resides under the encapsulation layer and extends from the sacrificial cavity material beneath the cavity portion to a point outside of the cavity portion and beneath the perimeter portion.

An access hole is formed through the perimeter portion of the encapsulation layer and to the sacrificial tunnel material. Preferably, this hole is not formed in the cover portion to help maintain the structural integrity of the cover portion. Once the hole is formed, the sacrificial tunnel material may be removed via the hole using an etching process or the like to form a tunnel that extends beneath the encapsulation layer to the sacrificial cavity material. The sacrificial cavity material may be removed using the hole and tunnel with the same or a different etching process. As a result, the device resides in an open cavity provided under the cover portion. The hole that provides access to the tunnel and cavity is ultimately sealed, preferably by applying an additional encapsulation layer over the cover portion and enough of the perimeter portion to seal off the hole therein.

Those skilled in the art will recognize that multiple tunnels and access holes may be employed to form the cavity and that various devices and materials may reside on or be considered as included in the substrate. Accordingly, the encapsulation layers and the sacrificial materials may reside on materials other than the substrate for different applications.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIGS. 5-17 illustrate successive steps during a semiconductor fabrication process for constructing a semiconductor device having an integrated MEMS switch according to one embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1A:
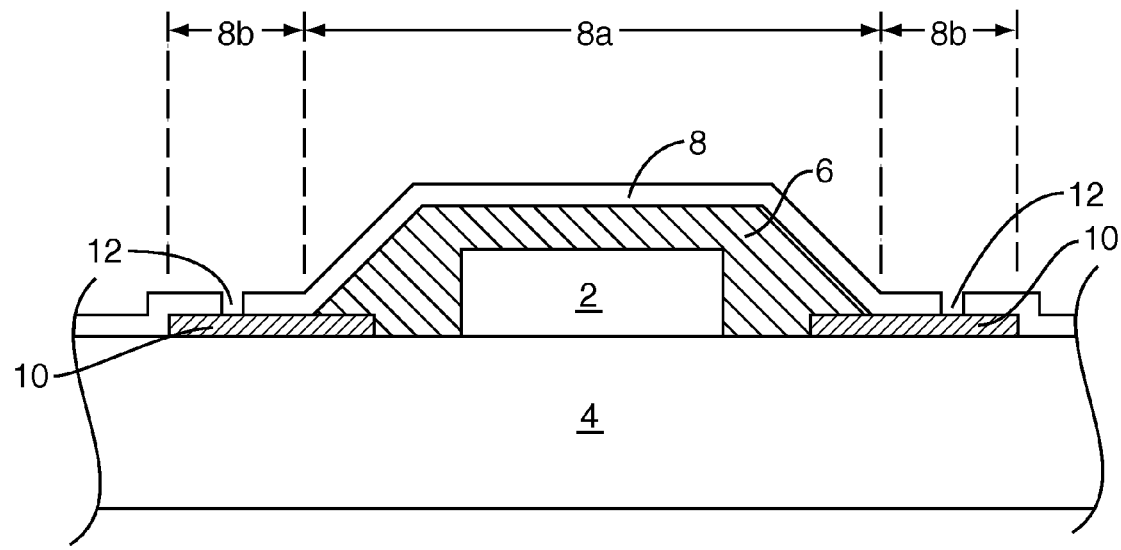
FIGS. 1A through 1D illustrate the formation of a semiconductor device according to an embodiment of the present invention.

FIG. 1A illustrates the formation of a semiconductor device in accordance with an embodiment of the present invention. Particularly, a component 2 is formed on a substrate 4. The component 2 may be any type of electronic device, such as a Surface Acoustic Wave (SAW) device, a Microelectromechanical Systems (MEMS) device, or the like. As may be seen in FIG. 1A, the component 2 is encapsulated by a sacrificial cavity material 6 where a first encapsulation layer 8 is formed over the sacrificial cavity material 6. Here, the sacrificial cavity material 6 is shaped in the form of a cavity, such that when the sacrificial cavity material 6 is removed, a cavity will be formed under the first encapsulation layer 8 and over the component 2, as will be detailed further on.

The first encapsulation layer 8 includes a cover portion 8a and a perimeter portion 8b. The cover portion 8a of the first encapsulation layer 8 encapsulates the component 2 and the sacrificial cavity material 6. The perimeter portion 8b of the first encapsulation layer 8 resides over the substrate 4 and about a perimeter of the cover portion 8a. In addition, as shown in FIG. 1A, a sacrificial tunnel material 10 resides under the first encapsulation layer 8 and extends from the sacrificial cavity material 6 beneath the cover portion 8a to a point outside of the cover portion 8a and beneath the perimeter portion 8b.

A hole 12 is formed in the perimeter portion 8b of the first encapsulation layer 8. The hole 12 extends through the perimeter portion 8b to the sacrificial tunnel material 10. Preferably, the hole 12 is not formed in the cover portion 8a and is instead formed in the perimeter portion 8b of the first encapsulation layer 8. As such, the structural rigidity of the cover portion 8a is maintained.

Figure 1B:
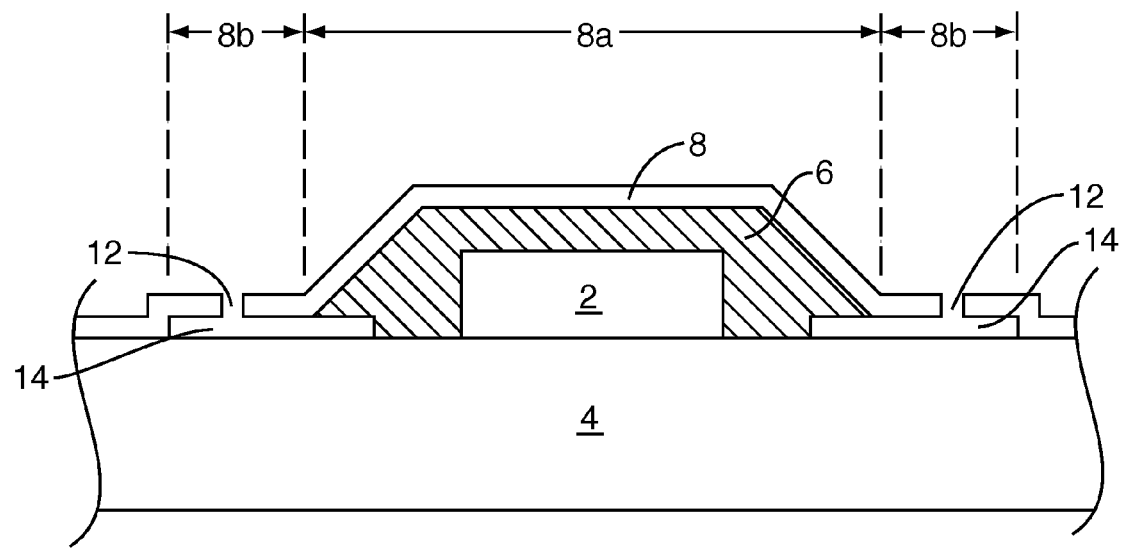
Figure 1C:
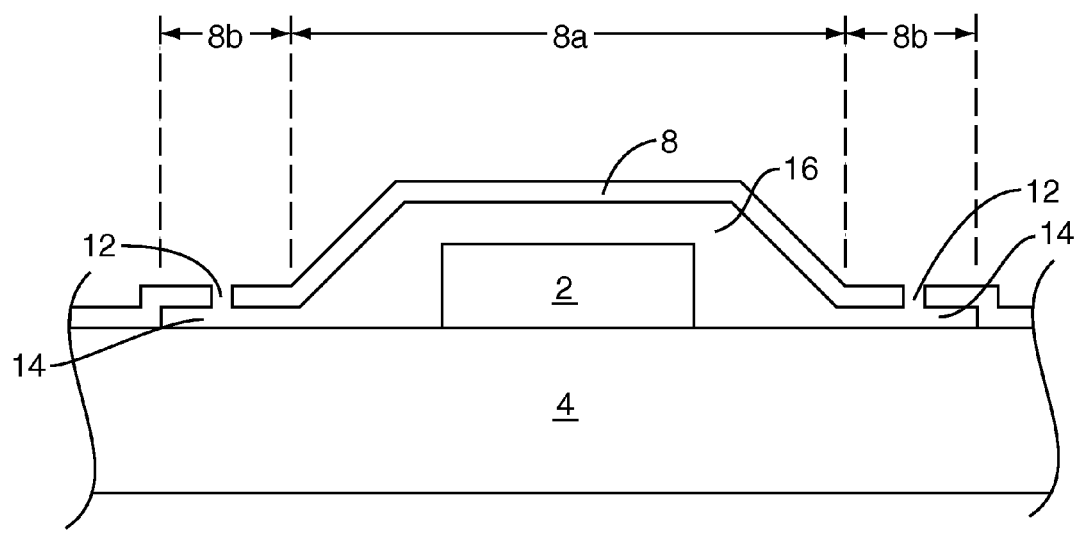

After formation of the hole 12, the sacrificial tunnel material 10 may be removed via the hole 12 using any suitable etching technique or the like, to form a tunnel 14, as shown in FIG. 1B. Once the sacrificial tunnel material 10 is removed, the sacrificial cavity material 6 is also removed using any suitable etching technique or the like to form a cavity 16, such that the component 2 resides in the cavity 16 under the first encapsulation layer 8, as shown in FIG. 1C. In accordance with an alternative embodiment of the present invention, where the sacrificial cavity material 6 and the sacrificial tunnel material 10 are formed from the same material, the sacrificial cavity material 6 and the sacrificial tunnel material 10 may be removed within the same process.

Figure 1D:
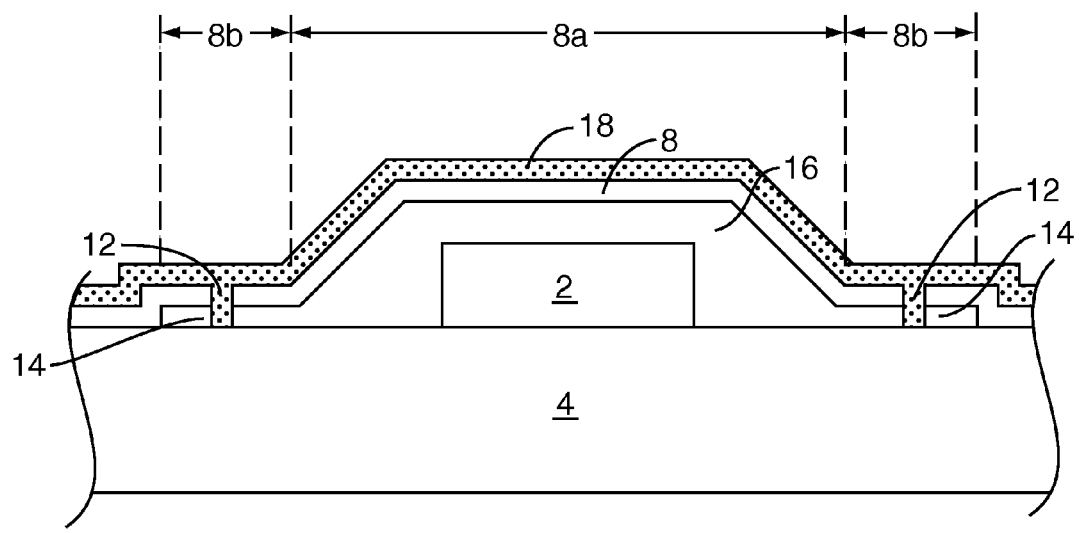

After the cavity 16 is formed about the component 2, a second encapsulation layer 18 is formed over the first encapsulation layer 8, as shown in FIG. 1D. As illustrated, the second encapsulation layer 18 is formed over the first encapsulation layer 8, such that the second encapsulation layer 18 fills in the hole 12 and seals the cavity 16.

As mentioned above, the component 2 may be any type of device, including a MEMS device. It should be noted that while only one component 2 is illustrated as being formed under the first and second encapsulation layers 8 and 18, any number of components may be formed under the first and second encapsulation layers 8 and 18 such that the first and second encapsulation layers 8 and 18 enclose more than one component. The remaining Figures, namely FIGS. 2A through 24, illustrate the formation of a MEMS device in accordance with the present invention. In particular, FIGS. 2A through 24 describe the formation of a MEMS device and then the formation of a cavity around the MEMS device using the principles described above with reference to FIGS. 1A through 1D, along with various embodiments thereof.

Figure 2A:
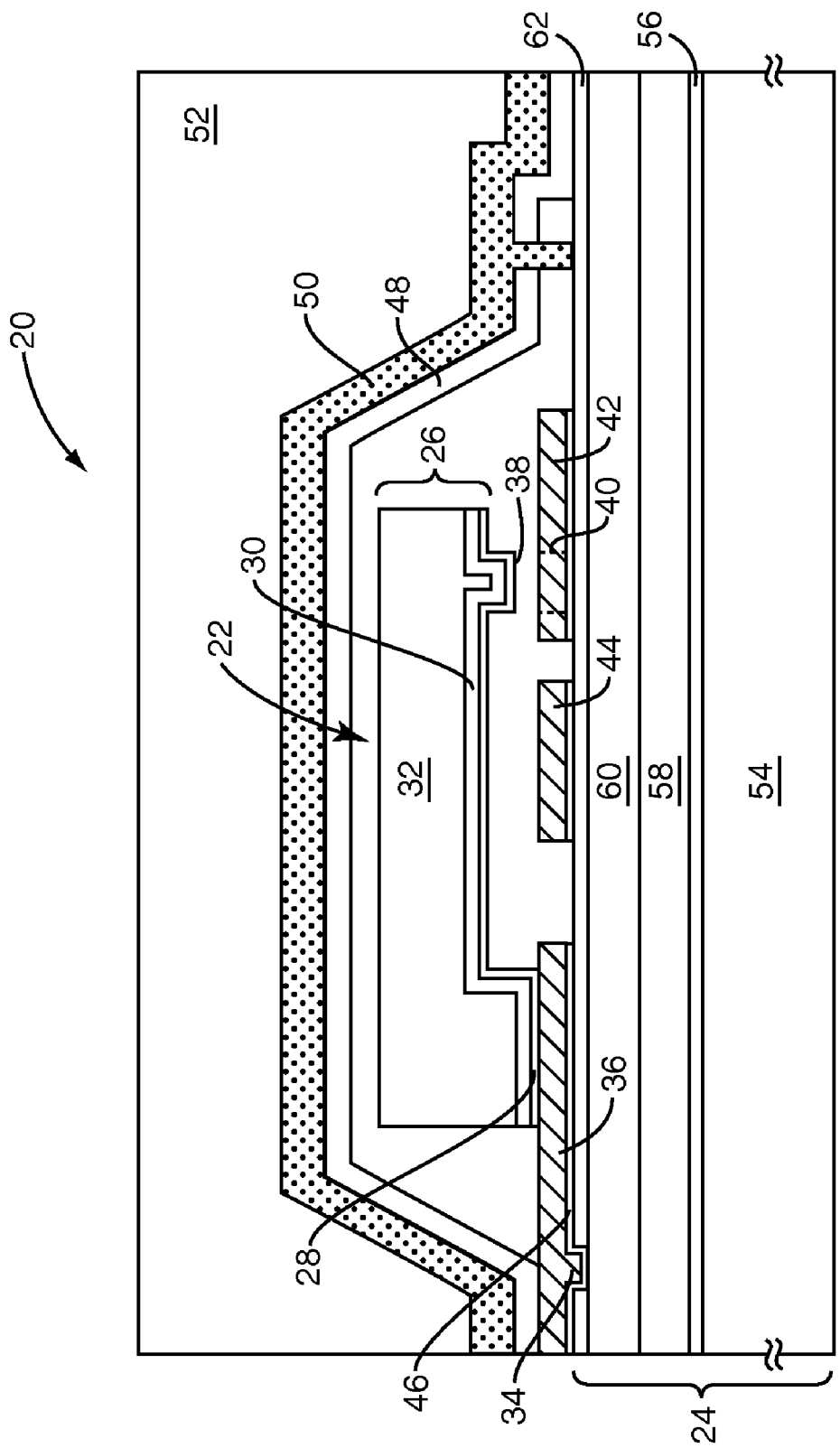
FIGS. 2A and 2B illustrate an exemplary microelectromechanical systems (MEMS) switch in open and closed positions, respectively.
Figure 2B:
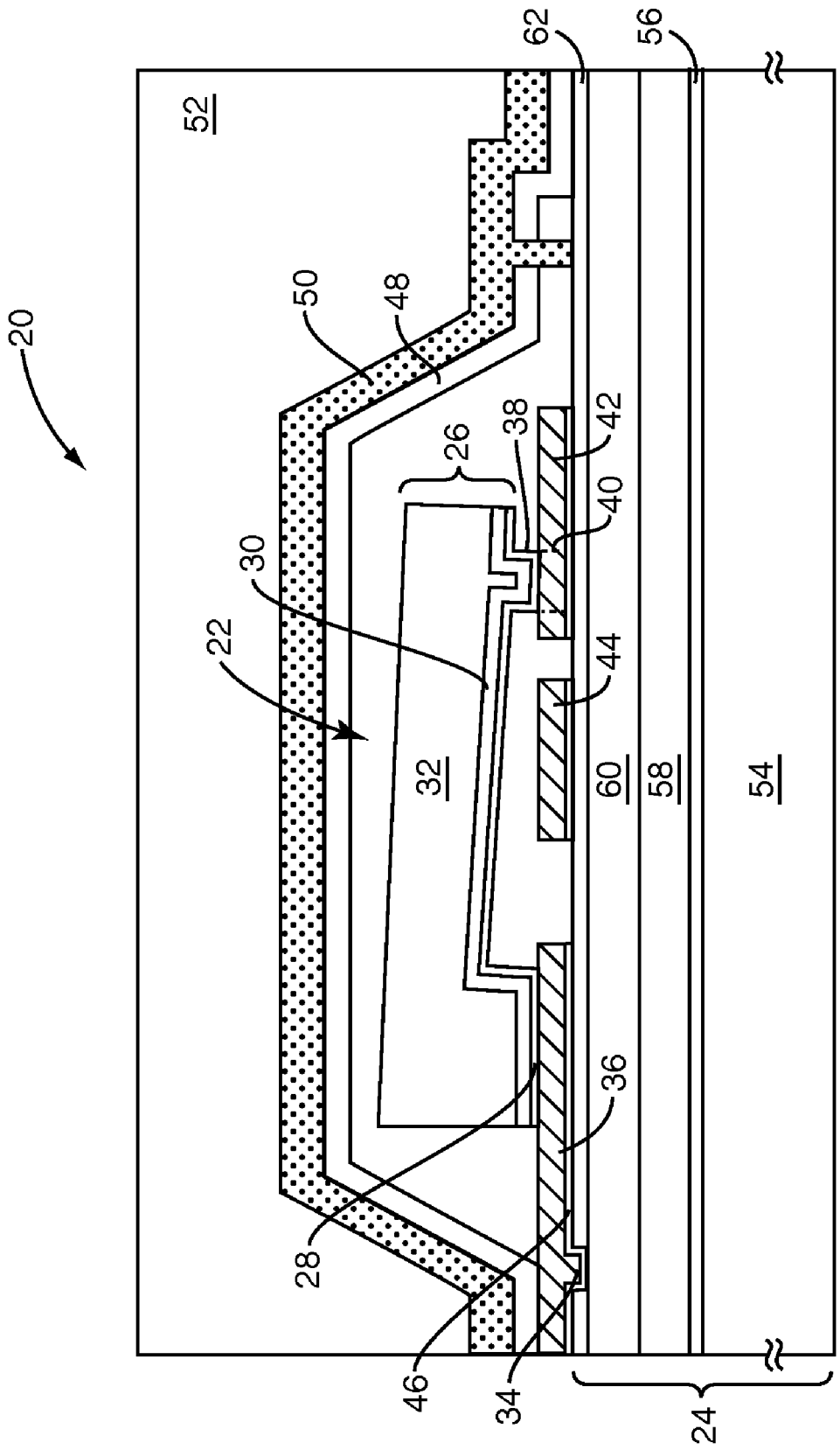

With reference to FIGS. 2A and 2B, a semiconductor device 20 having a MEMS switch 22 is illustrated according to one embodiment of the present invention. The MEMS switch 22 is effectively formed on a semiconductor substrate 24. The MEMS switch 22 includes a cantilever 26, which is formed from a conductive material, such as gold. In an embodiment where the cantilever 26 is formed from gold, the cantilever 26 may include an adhesive layer 28 and two separate layers 30 and 32 formed from gold, where the layer 32 is substantially thicker than the layer 30. The adhesive layer 28 minimizes the possibility of peeling occurring between the layer 30 and conductive pads. In accordance with an embodiment of the present invention, the adhesive layer 28 may be formed from titanium, titanium tungsten, chromium, or any other material to which gold adheres. It will have a nominal thickness of 500 Å. The layer 30 will be deposited at a nominal thickness of 2500 Å and will act as a seed layer for the layer 32, when the layer 32 is gold plated. The layer 32 can have a nominal thickness of greater than 5µ.

Furthermore, the cantilever 26 has a first end and a second end. The first end is coupled to the semiconductor substrate 24 with a via 34 by a first conductive pad 36. The first end of the cantilever 26 is electrically and mechanically coupled to the first conductive pad 36. Notably, the first conductive pad 36 may play a role in anchoring the first end of the cantilever 26 to the semiconductor substrate 24 as depicted.

The second end of the cantilever 26 forms or is provided with a cantilever contact 38, which, as depicted in FIG. 2A, is suspended over a contact portion 40 of a second conductive pad 42. Thus, when the MEMS switch 22 is actuated, as shown in FIG. 2B, the cantilever 26 moves the cantilever contact 38 into electrical contact with the contact portion 40 of the second conductive pad 42 to electrically connect the first conductive pad 36 to the second conductive pad 42.

Returning to FIG. 2A, in order to actuate the MEMS switch 22, and in particular to cause the cantilever 26 to move the cantilever contact 38 into contact with the contact portion 40 of the second conductive pad 42, an actuator plate 44 is disposed over a portion of the semiconductor substrate 24 and under a portion of the cantilever 26. To actuate the MEMS switch 22, an electrostatic voltage is applied to the actuator plate 44. The presence of the electrostatic voltage creates an electromagnetic field that effectively moves the cantilever 26 toward the actuator plate 44, thus moving the cantilever 26 from the position illustrated in FIG. 2A to the position illustrated in FIG. 2B.

In the illustrated embodiment, the first conductive pad 36, the second conductive pad 42, and the actuator plate 44 are formed from a single metallic or conductive layer, such as gold, copper, platinum, or the like. In an embodiment where the first conductive pad 36, the second conductive pad 42, and the actuator plate 44 are formed from gold, an adhesive layer 46, which may be formed from titanium, titanium tungsten, chromium, or any other material to which gold adheres, is formed on the semiconductor substrate 24. The particular form factor for the first conductive pad 36, the second conductive pad 42, and the actuator plate 44 is provided through an etching or other patterning technique. With continued reference to FIGS. 2A and 2B, the MEMS switch 22 may be encapsulated by one or more encapsulation layers 48 and 50, which form a substantially hermetically sealed cavity about the cantilever 26. In accordance with an embodiment of the present invention, the encapsulating layers may be formed from silicon nitride, or any other material which may be used to seal, and in some embodiments, strengthen, the semiconductor device 20. The cavity is generally filled with an inert gas. Once the encapsulation layers 48 and 50 are in place and any other semiconductor components are formed on the semiconductor substrate 24, an overmold 52 may be provided over the encapsulation layers 48 and 50 and any other semiconductor components.

With continued reference to FIGS. 2A and 2B, the semiconductor substrate 24 is preferably formed using a semiconductor-on-insulator process, such as a silicon- or sapphire-on-insulator process. In particular, the semiconductor substrate 24 includes a handle wafer 54 that may be formed from silicon, sapphire, glass, gallium arsenide (GaAs), or like polycrystalline material to form a foundation layer for the semiconductor device 20. In the illustrated embodiment, the handle wafer 54 is approximately a few hundred microns thick. An insulator layer 56 is formed over the handle wafer 54. The insulator layer 56 may be a dielectric and may generally be formed from an oxide, such as silicon dioxide, which may range in thickness from 0.1 to 2 microns in the preferred embodiment. In an embodiment where the handle wafer 54 is formed from glass, the semiconductor device 20 may not need the insulator layer 56.

A device layer 58, which may include one or more layers, is formed over the handle wafer 54 and the insulator layer 56 using an appropriate semiconductor material. The device layer 58 is the layer or layers in which active semiconductor devices, such as transistors and diodes that employ PN junctions, are formed. The device layer 58 is initially formed as a base semiconductor layer that is subsequently doped with N-type and P-type materials to form the active semiconductor devices. Thus, the active semiconductor devices, except for any necessary contacts or connection traces, are generally contained within the device layer 58. Those skilled in the art will recognize various techniques for forming active semiconductor devices in the device layer 58. A metal-dielectric stack 60 is formed over the device layer 58, wherein a plurality of metal and dielectric epitaxial layers are alternated to facilitate connection with and between the active devices formed in the device layer 58. Further, in one embodiment, the device layer 58 may be formed from a high resistance semiconductor material having a resistivity of about 1000 ohm-cm. Alternatively, the device layer 58 may be formed from a low-resistivity semiconductor material where resistance is about 10 ohm-cm.

In the present invention, active semiconductor devices may be formed in the device layer 58 and connected to one another via the metal-dielectric stack 60 directly underneath the MEMS switch 22. Since the device layer 58 resides over the insulator layer 56, high voltage devices, which may exceed 50 to 100 volts in operation, may be formed directly under the MEMS switch 22 and connected in a way to control operation of the MEMS switch 22 or associated circuitry. In order to control the MEMS switch, one of the first conductive pad 36, the second conductive pad 42, or the actuator plate 44 may be connected to the metal-dielectric stack 60 through a passivation layer 62. Although silicon is described in the preferred embodiment, the semiconductor material for the device layer 58 may include GaAs, gallium nitride (GaN), indium phosphide (InP), silicon germanium (SiGe), sapphire, and like semiconductor materials. For the preferred embodiment, the device layer 58 ranges in thickness from about 0.1 microns to about 20 microns.

As illustrated in FIGS. 2A and 2B, the passivation layer 62 may be provided over the metal-dielectric stack 60, and in a CMOS process, may represent the end of the CMOS process. In one embodiment of the present invention, the passivation layer 62 may be formed from silicon nitride (SiN) or any other suitable insulator. The metal layer used to form the first conductive pad 36, the second conductive pad 42, and the actuator plate 44 may be formed over the passivation layer 62 and etched to form the respective ones of the first conductive pad 36, the second conductive pad 42, and the actuator plate 44.

Figure 3:
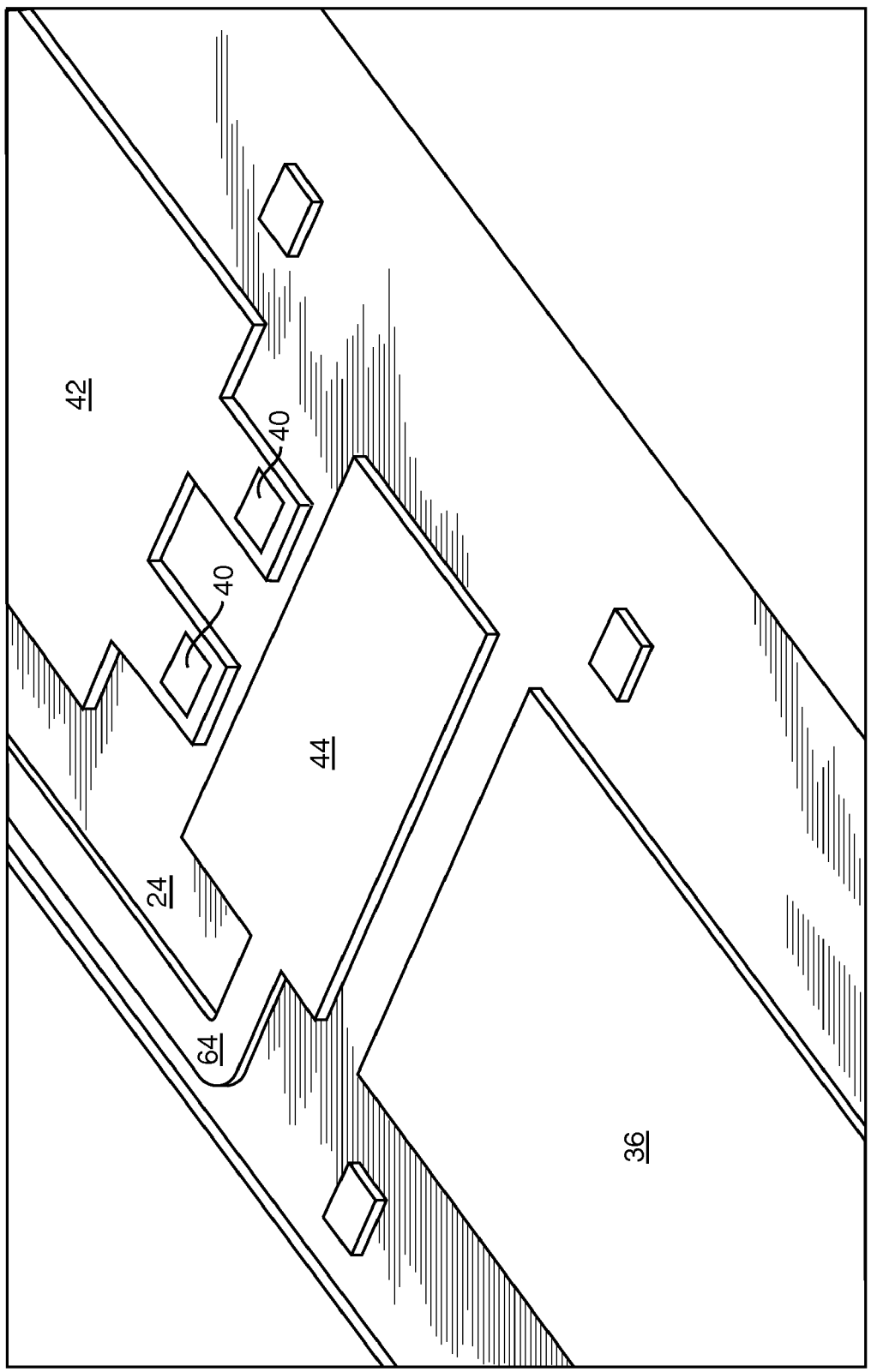
FIG. 3 is a perspective view of a portion of the MEMS switch without a cantilever.

With reference to FIG. 3, a perspective view of a portion of the MEMS switch 22 is provided to more clearly illustrate an exemplary configuration of the MEMS switch 22. The cantilever 26 is not illustrated in order to better depict the first conductive pad 36, the second conductive pad 42, the actuator plate 44, and the contact portion 40 of the second conductive pad 42. Also illustrated is an actuator control path 64, which provides an electrical path to present an electrostatic voltage to the actuator plate 44.

Figure 4:
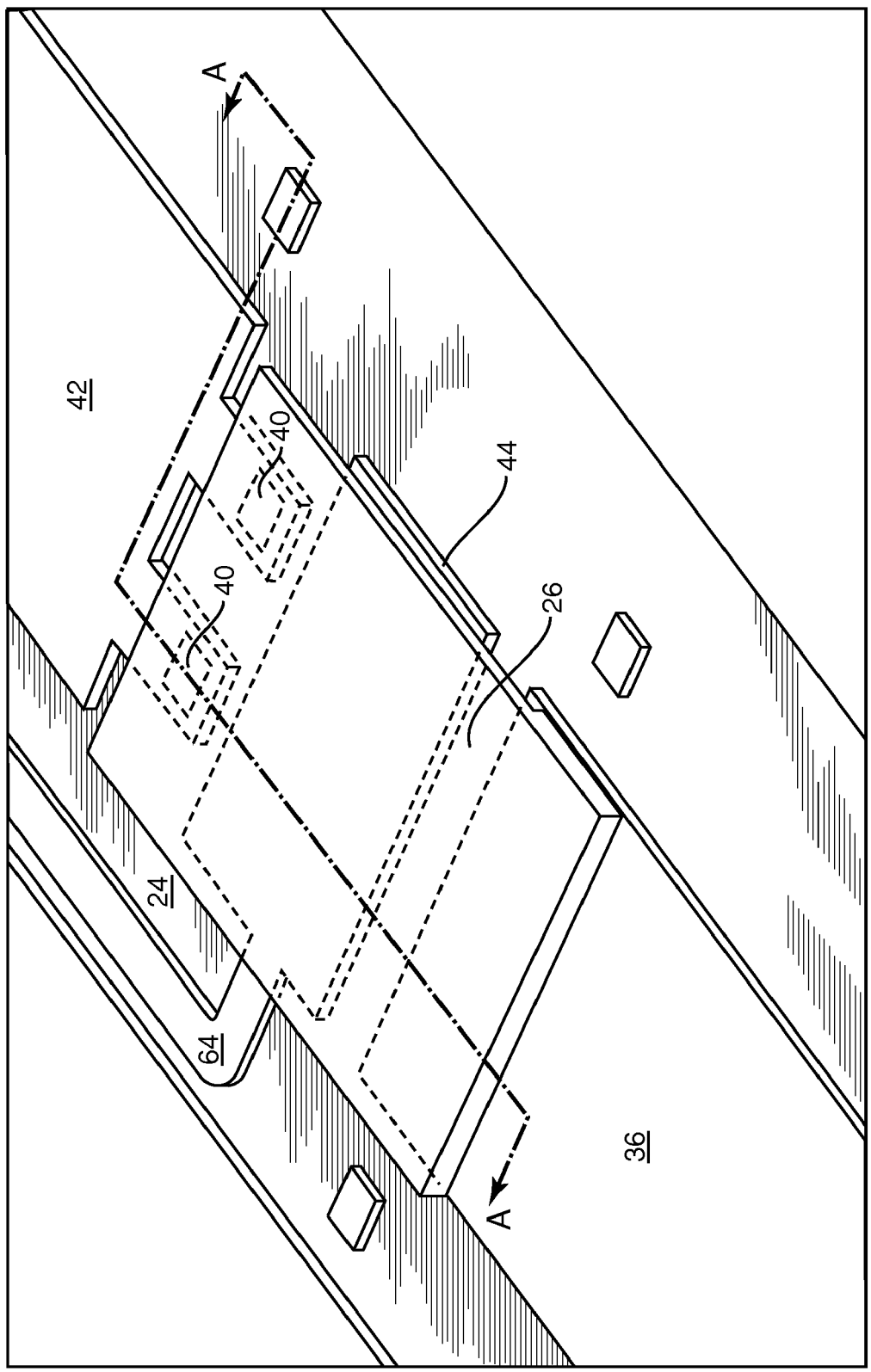
FIG. 4 is a perspective view of the MEMS switch with a cantilever.

With reference to FIG. 4, the MEMS switch 22 of FIG. 3 is illustrated with the cantilever 26. Notably, the cantilever 26 may be affixed to the first conductive pad 36. Further, the cantilever 26 extends over the actuator plate 44 as well as the contact portion 40 of the second conductive pad 42. When the MEMS switch 22 is not actuated, the cantilever 26 remains suspended over the contact portion 40 of the second conductive pad 42.

Figure 5:
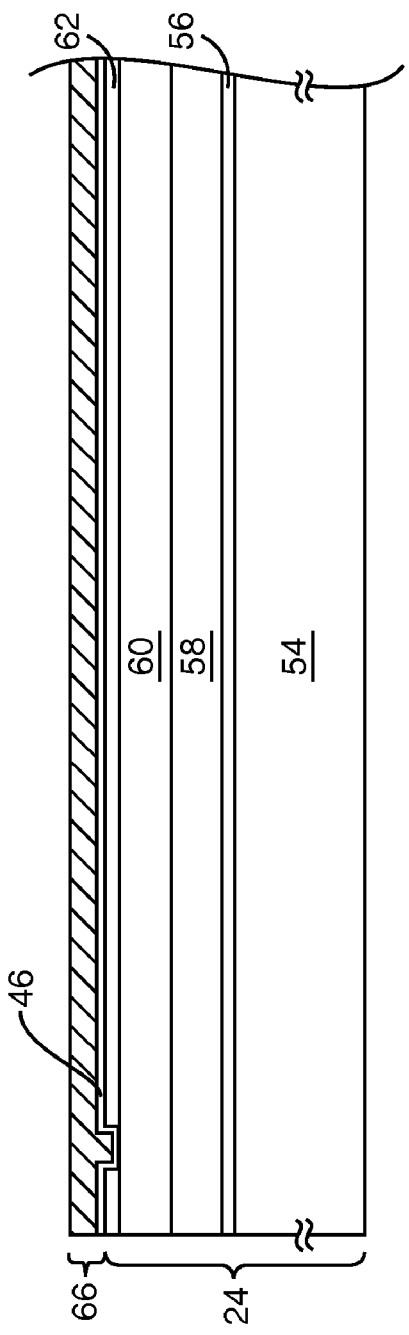

With reference to FIGS. 5-17, an exemplary process for forming the semiconductor device 20 of FIGS. 2A and 2B is provided. The views shown with reference to FIGS. 5-17 are taken along line A-A shown in FIG. 4. As depicted in FIG. 5, the semiconductor substrate 24, which includes the handle wafer 54, the insulator layer 56, the device layer 58, the metal-dielectric stack 60, and the passivation layer 62 is provided. In one embodiment of the present invention, any active devices to be provided underneath the MEMS switch 22 may be created in the device layer 58 and the contacts with these active devices and interconnections between these active devices may be formed in the metal-dielectric stack 60. Over the passivation layer 62, a conductive layer 66 is provided. In an exemplary embodiment, the conductive layer 66 may be formed with gold, where the conductive layer 66 includes the adhesive layer 46, as shown in FIG. 5.

Figure 6:
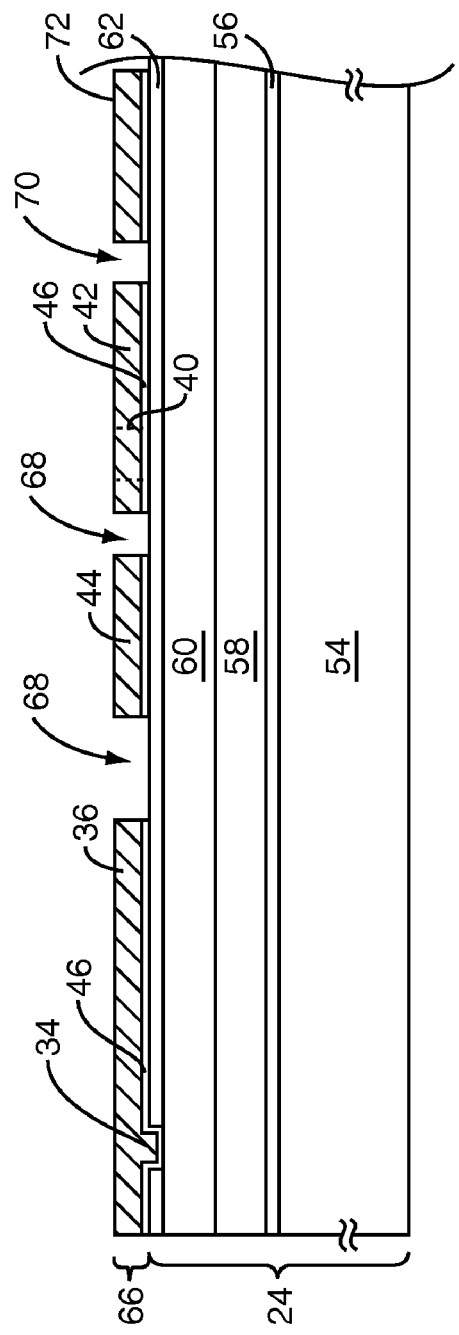

As illustrated in FIG. 6, the conductive layer 66 is then etched to form the first conductive pad 36, the second conductive pad 42, and the actuator plate 44. In addition, the conductive layer 66 is etched to form trenches 68 and a trench 70, which forms a sacrificial conductive pad 72. In a preferred embodiment, the sacrificial conductive pad 72 may be the functional equivalent of the sacrificial tunnel material shown in FIG. 1A. In an exemplary embodiment of the present invention, the sacrificial conductive pad 72 may be formed from the same material used to form the first conductive pad 36, the second conductive pad 42, and the actuator plate 44. However, in accordance with further embodiments of the present invention, the sacrificial conductive pad 72 may be formed from any type of sacrificial material, such as other metals or the like, which is separate from the material used to form the first conductive pad 36 and the second conductive pad 42. Moreover, the sacrificial conductive pad 72 may be formed in a process which is separate from the process used to form the first and second conductive pads 36 and 42. The conductive layer 66 may also provide various traces to other circuitry that is formed on or in the semiconductor substrate 24, including the active devices that are formed underneath the MEMS switch 22.

Figure 7:
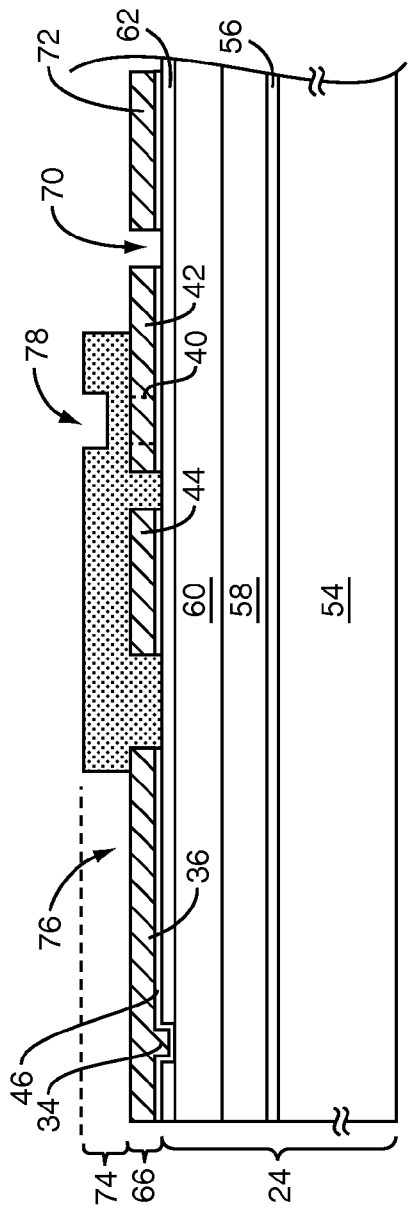

As illustrated in FIG. 7, a first sacrificial layer 74 is formed over the first conductive pad 36, the second conductive pad 42, the actuator plate 44, and the exposed portions of the passivation layer 62. In accordance with embodiments of the present invention, the first sacrificial layer 74 may be formed with polymethylglutarimide (PMGI), ProTEK® available from Brewer Science, Inc., located in Rolla, Mo., photoresist, metals, such as copper, or any other material that is easily shaped and easily removed.

Figure 8:
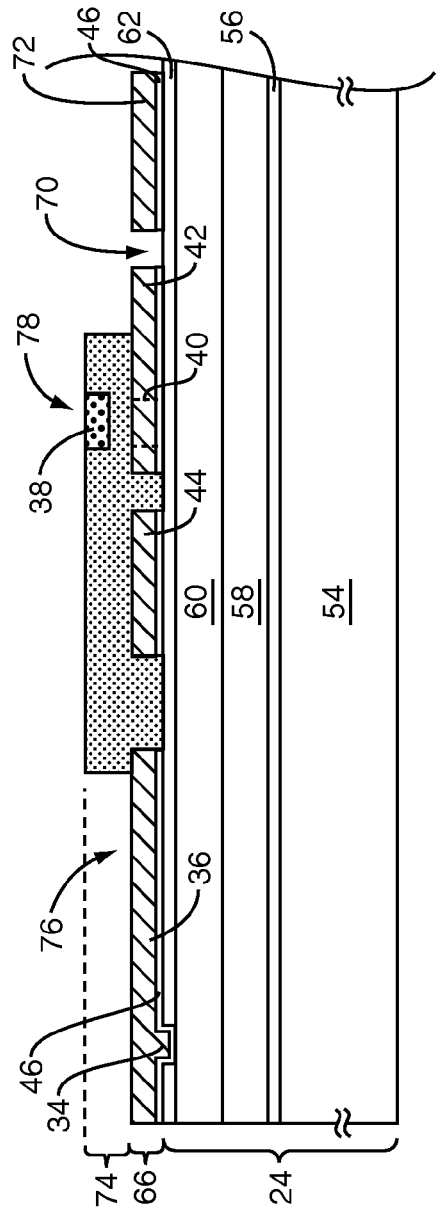

Moreover, although not shown, in accordance with an embodiment of the present invention, a portion of the sacrifical layer may be deposited in the trench 70, thereby creating a stop where the stop is formed with the same material as the first sacrificial layer 74, such as PMGI, ProTEK®, photoresist, metals, or any other material that is easily shaped and easily removed. Therefore, the stop may be used as an etch stop during subsequent processing of the semiconductor device 20. Next, the first sacrificial layer 74 is etched to provide an area for an anchor region 76 and the bottom portion of the cantilever 26, along with a contact opening 78. As illustrated, the anchor region 76 and the contact opening 78 for the cantilever contact 38 are depicted. Next, the cantilever contact 38 is formed in the contact opening 78, as shown in FIG. 8. The cantilever contact 38 may be formed from various materials, such as gold, platinum alloys, gold alloys, dispersion strengthened alloys, or the like.

As illustrated in FIG. 9, the cantilever 26 for the MEMS switch 22 is formed over the first sacrificial layer 74. In embodiments where the cantilever 26 includes the adhesive layer 28 and the layers 30 and 32, as shown in FIG. 2A, the blanket adhesive layer 28 and the seed layer 30 for electroplating are formed using any well-known deposition technique, such as sputtering, evaporation, or the like. Furthermore, after formation of the blanket layer 30, a photo-resist (PR) mold for electroplating the layer 32 is formed. After completing the layer 32, the PR mold is stripped. The adhesive layer 28 and the seed layer 30, except underneath the layer 32, are etched using any suitable etching technique such as wet etching. As may be seen in FIG. 9, the cantilever contact 38 connects to the cantilever 26. Once the cantilever 26 for the MEMS switch 22 is formed, a second sacrificial layer 80 is formed over the first sacrificial layer 74, and the cantilever 26 of the MEMS switch 22, as illustrated in FIG. 10. As may be seen with reference to FIG. 10, when the second sacrificial layer 80 is formed over the first sacrificial layer 74, a portion of the material used to form the second sacrificial layer 80 is deposited in the trench 70, thereby forming a stop 82. In accordance with embodiments of the present invention, the second sacrificial layer 80 may be formed with PMGI, ProTEK®, photoresist, metals, or any other material that is easily shaped and easily removed.

FIGS. 11-14 illustrate a technique for creating a cavity in which the cantilever 26 of the MEMS switch 22 is provided. With particular reference to FIG. 11, the second sacrificial layer 80 is etched, wherein the remaining portions of the second sacrificial layer 80 form the overall shape of the cavity to be formed around the cantilever 26 of the MEMS switch 22. Moreover, when the first and second sacrificial layers 74 and 80 are etched, a portion of the sacrificial conductive pad 72 is exposed, as shown in FIG. 11. In one embodiment, the remaining portions of the second sacrificial layer 80 form a shape approximating a dome. In an alternate embodiment, the remaining portions of the first and second sacrificial layers 74 and 80 form a shape approximating a dome.

Figure 13:
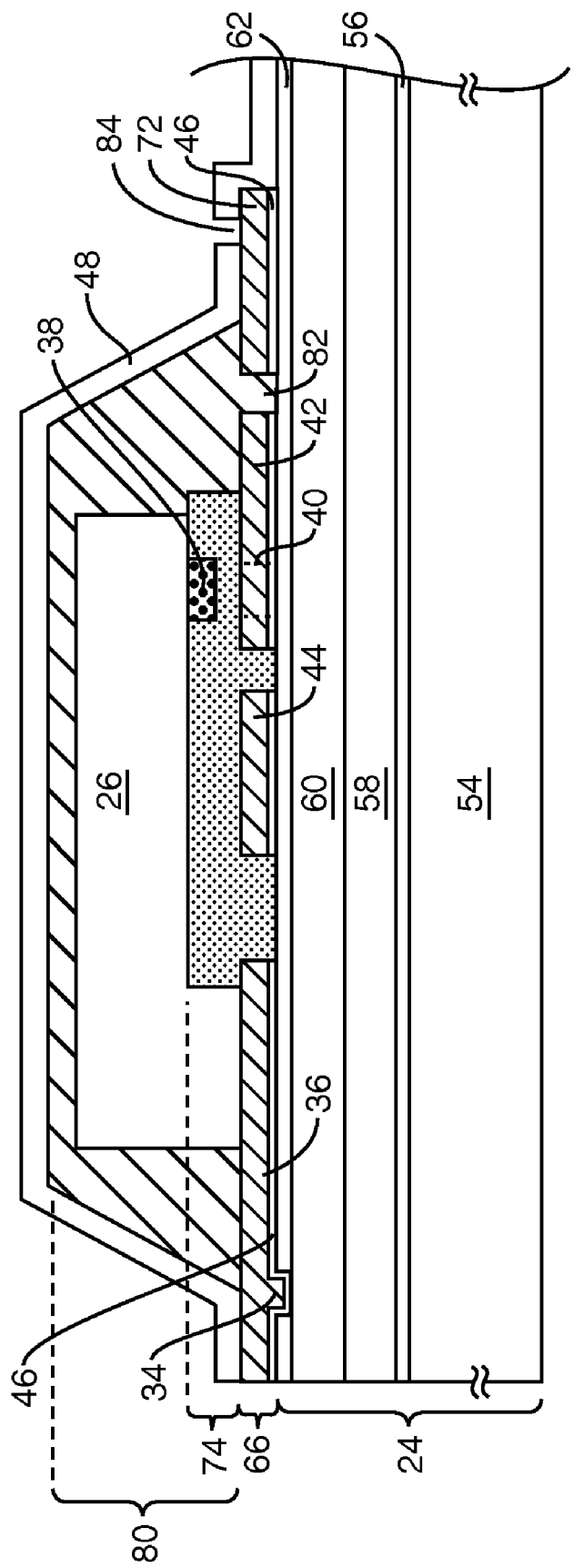

Once the first and second sacrificial layers 74 and 80 are etched to have a shape approximating a dome, the first encapsulation layer 48 is formed over the first and second sacrificial layers 74 and 80 as well as over a portion of the first conductive pad 36 and over a portion of the sacrificial conductive pad 72, as shown in FIG. 12. An encapsulation layer opening 84 is then etched within the first encapsulation layer 48 to expose a portion of the sacrificial conductive pad 72, as illustrated in FIG. 13. The encapsulation layer opening 84 may have any type of configuration, such as a circular configuration, a slit configuration, or any other configuration that allows for the flow of an etchant therethrough, such as a circular, oval, rectangular, polygonal, and any array of configurations.

Figure 14:
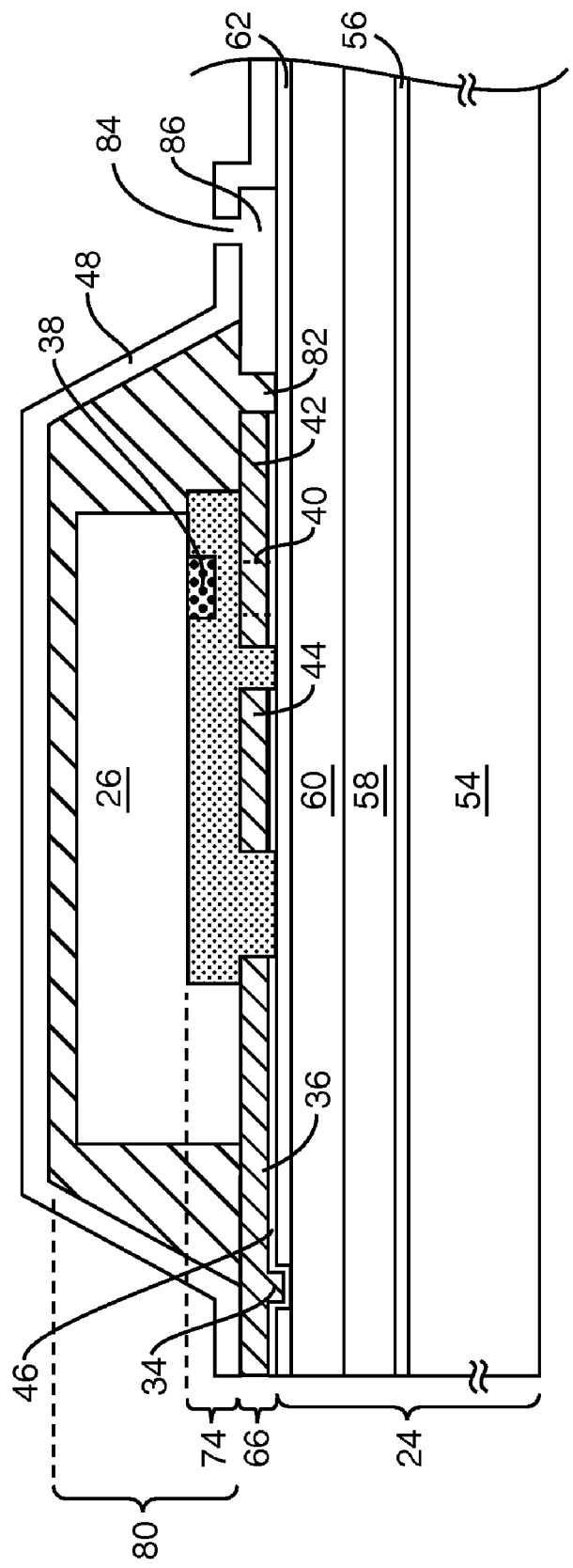

Next, the sacrificial conductive pad 72 is removed using an appropriate etching process or the like, as illustrated in FIG. 14. In accordance with an embodiment of the present invention where the sacrificial conductive pad is formed with gold, an appropriate etchant, such as aqua regia, potassium iodide-based gold etchant, or the like, may be used to remove the sacrificial conductive pad 72 during a wet etching operation. Moreover, in an embodiment where the sacrificial conductive pad 72 is formed from gold, after the gold is etched, the adhesive layer 46 is also etched. However, it should be noted that in embodiments where the sacrificial conductive pad 72 is formed from gold, the adhesive layer 46 may not be etched and may remain during subsequent removal of material disposed within the first encapsulation layer 48. In embodiments where the adhesive layer 46 is formed with titanium, titanium tungsten, or chromium, any suitable etchant, such as a combination of hydrofluoric acid (HF) and water at a 1:9 ratio or some ratio of buffered oxide etch for titanium etching or hydrogen peroxide for titanium tungsten etching, may be used during a wet etching process. As may be seen with reference to FIG. 14, when the sacrificial conductive pad 72 is etched, the first and second conductive pads 36 and 42 and the actuator plate 44 are not etched. In accordance with an embodiment of the present invention, the stop 82, which is formed from the first or second sacrificial layer 74 or 80, prevents the etchants used to etch the sacrificial conductive pad 72 and the adhesive layer 46 from etching the first and second conductive pads 36 and 42 and the actuator plate 44. The material used to form the stop 82 may differ from the material of the sacrificial conductive pad 72. Accordingly, the etchant that removes the sacrificial conductive pad 72 will not react with the stop 82. Etching the sacrificial conductive pad 72 creates a tunnel 86 extending from the encapsulation layer opening 84 to the stop 82, as shown in FIG. 14.

Figure 15:
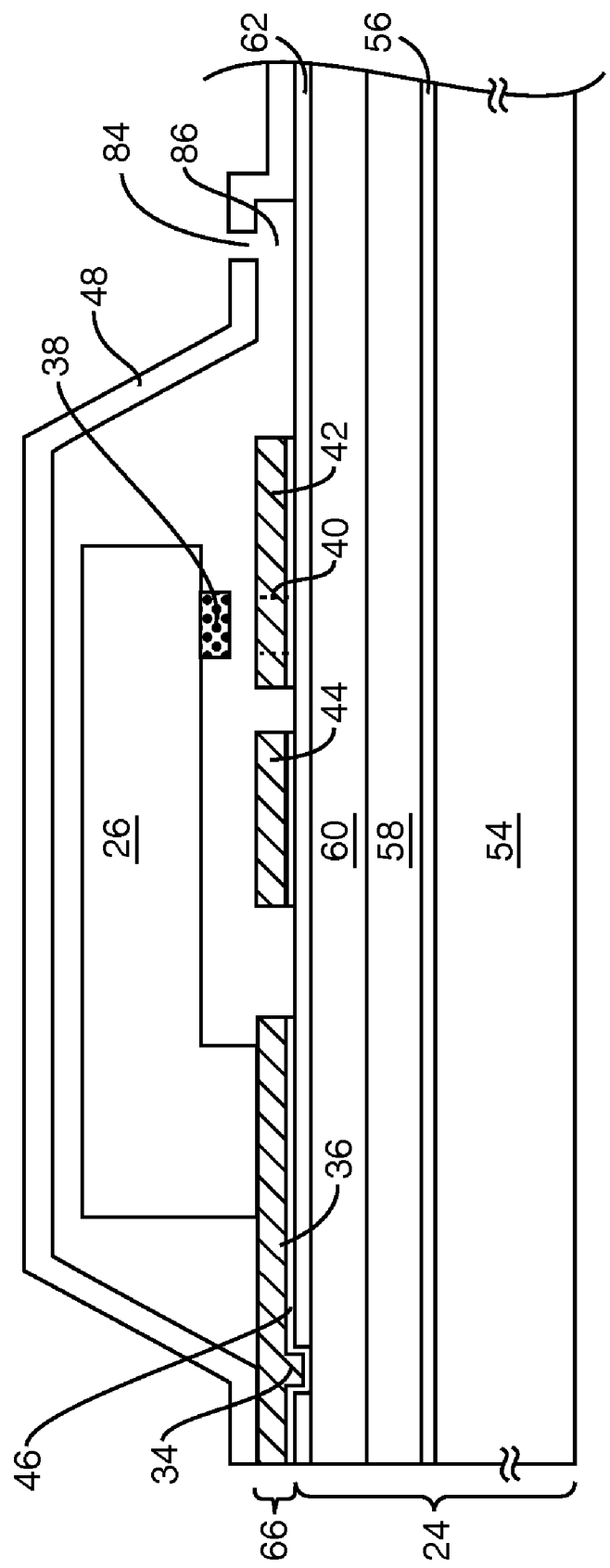

Once the sacrificial conductive pad 72 is removed, the first and second sacrificial layers 74 and 80, which are within the first encapsulation layer 48, are removed using an appropriate etching process or the like, as illustrated in FIG. 15. A dry etch operation may be used to remove the first and second sacrificial layers 74 and 80. In a dry etch operation, the semiconductor device 20 is placed in an oxygen chamber and an oxygen plasma is used to burn off the first and second sacrificial layers 74 and 80.

Furthermore, a wet etch may be used where the semiconductor device is placed in a bath comprising a solution, such as N-Methylpyrrolidone (NMP) at 80° C. or Tetramethylammonium hydroxide (TMAH)-based photoresist developer (AZ MIF300) in the case of PMGI or ammonium persulfate for copper, suitable to dissolve the first and second sacrificial layers 74 and 80. When the semiconductor device 20 is placed in a bath during wet etching, etchant enters through the encapsulation layer opening 84, passes through the tunnel 86 and comes into contact with the first and second sacrificial layers 74 and 80. In an embodiment where the first and second sacrificial layers 74 and 80 are made with PMGI, NMP may be used to remove the first and second sacrificial layers 74 and 80, wherein the semiconductor device 20 is placed in the bath for two to three hours. In an embodiment where ProTEK® is used to form the first and second sacrificial layers 74 and 80, acetone may be used to remove the sacrificial layers, wherein the semiconductor device 20 is placed in the bath for two to three hours. It should be noted that during removal of the first and second sacrificial layers 74 and 80, a combination of a dry etch process and a wet etch process may be used.

Once the etch process is complete, the cavity is dried. Particularly, the semiconductor device 20 is subjected to a critical point drying process. Critical point drying may be used to reduce and/or eliminate stiction phenomena. Stiction may occur due to high surface tension which is created when a liquid, such as deionized water, dries in air. Stiction may cause permanent sticking of the cantilever 26 in a deflected state. Critical point drying dries the device by transitioning the liquid, such as liquid carbon dioxide, into a gaseous state through the thermodynamic critical point of the liquid. At the thermodynamic critical point, little surface tension is observed on the path to the gaseous state.

At this point, the cantilever 26 of the MEMS switch 22 is anchored to the semiconductor substrate 24 via the first conductive pad 36, and is suspended in a cavity formed underneath the first encapsulation layer 48 and above the semiconductor substrate 24, as shown in FIG. 15. Notably, the portion of the first sacrificial layer 74 that was underneath the cantilever 26 is removed, such that the cantilever 26 may deflect and thus move toward the semiconductor substrate 24 when the MEMS switch 22 is actuated in order to allow the cantilever contact 38 to come into contact with the contact portion 40 of the second conductive pad 42.

Figure 16:
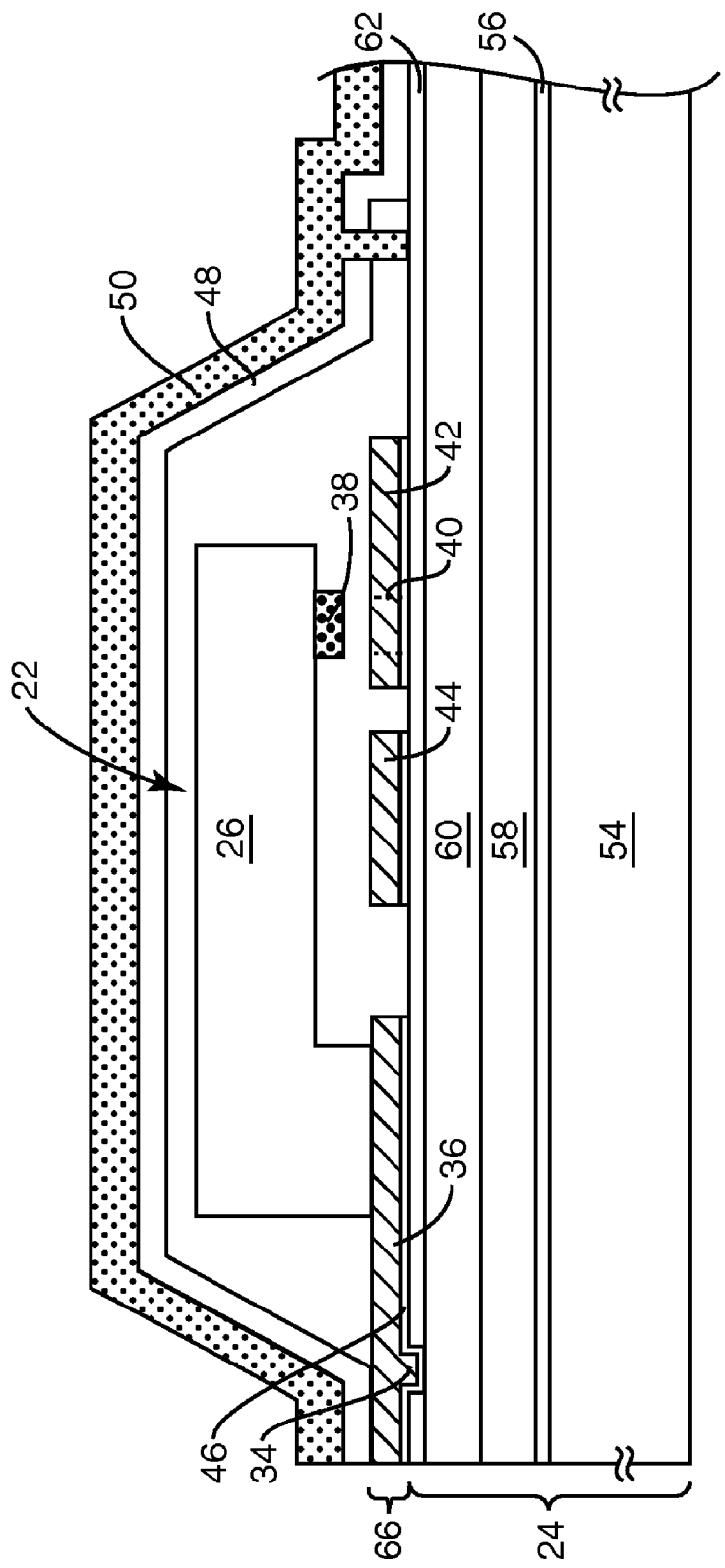
Figure 17:
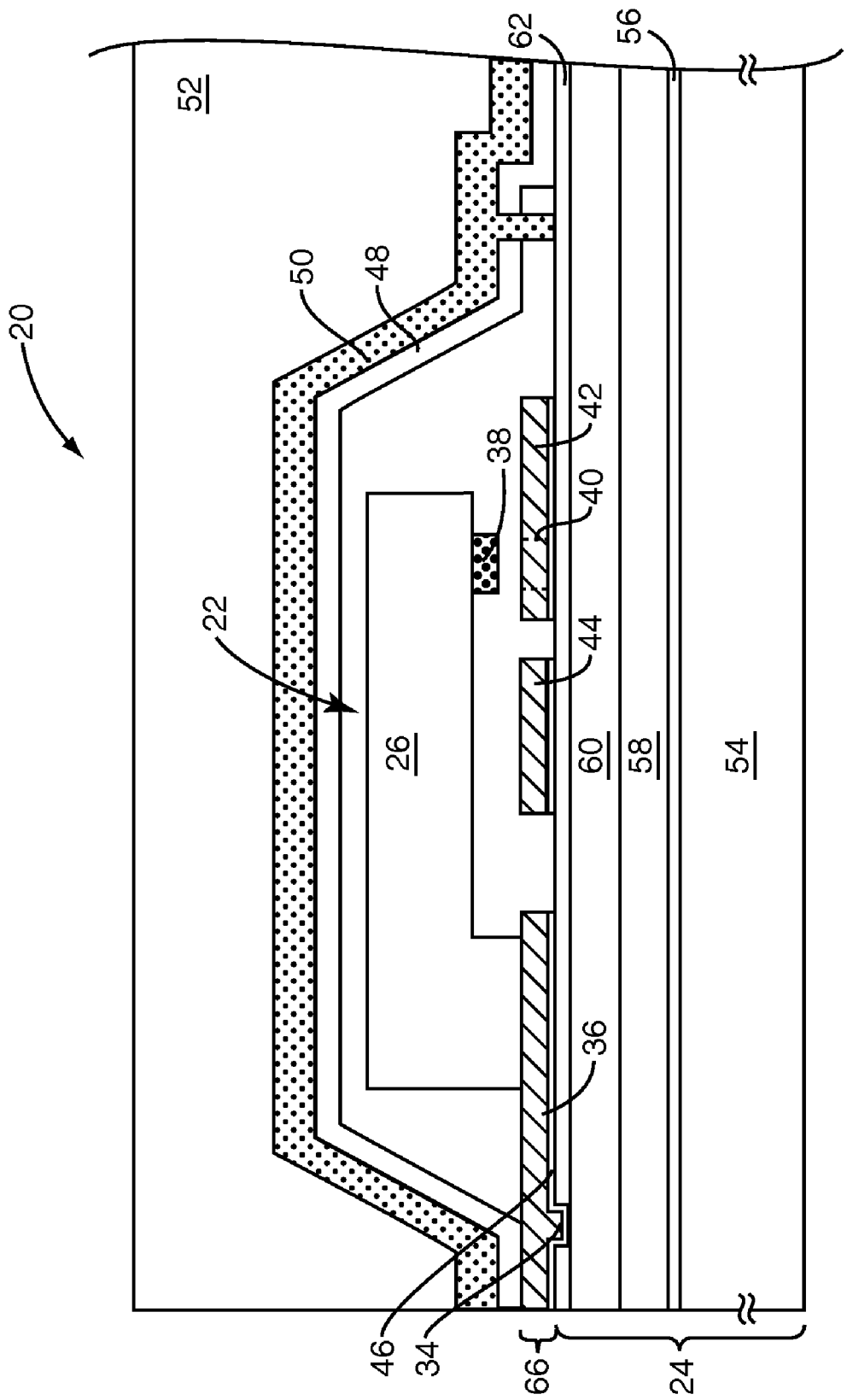

The cavity formed as a result of the removal of the remaining portions of the first and second sacrificial layers 74 and 80 may be filled with an inert gas during the fabrication process. In one embodiment, the cavity in which the semiconductor device 20 is being formed is filled with the inert gas, and subsequently, or simultaneously in the case of a second encapsulation layer, such as silicon nitride being deposited via PECVD or PVD, the second encapsulation layer 50 is formed over the first encapsulation layer 48, as illustrated in FIG. 16. The second encapsulation layer 50 provides further structural rigidity to the dome formed over the MEMS switch 22, and seals the encapsulation layer opening 84 that was created in the first encapsulation layer 48. Thus, the inert gas is trapped in the cavity formed by the first and second encapsulation layers 48 and 50. Finally, after opening of the bond pads and flip-chip bumping, the overmold 52 is provided over the exposed portions of the semiconductor substrate 24, and in particular over the second encapsulation layer 50, as shown in FIG. 17. Any number of encapsulation layers may be used to ensure that the overmold process used to put the overmold 52 over the semiconductor substrate 24 does not destroy the dome formed by the first and second encapsulation layers 48 and 50.

Figure 18:
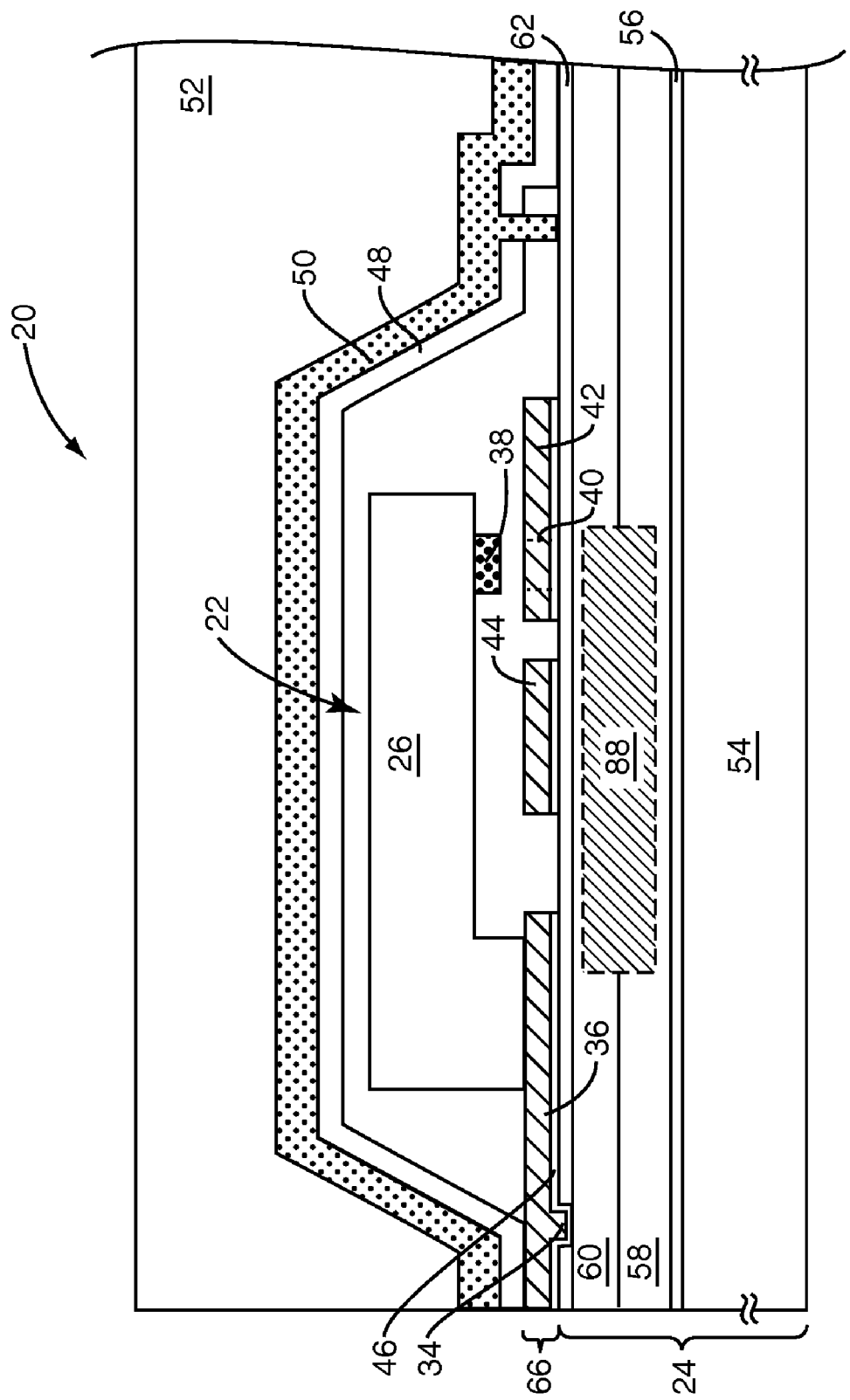
FIG. 18 is a block representation of a second embodiment of the MEMS switch integrated into the semiconductor device.

With reference to FIG. 18, various active components, contacts for these components, and interconnects between these components may be formed in the device layer 58 and the metal-dielectric stack 60 to form electronic circuitry 88, which resides directly underneath the MEMS switch 22, and in particular, underneath the cantilever 26 or the space formed by the first and second encapsulation layers 48 and 50. The electronic circuitry 88 may be used to control the MEMS switch 22 or otherwise connect to the MEMS switch 22 via the first conductive pad 36, the second conductive pad 42, the actuator plate 44, or any combination thereof. Thus, the electronic circuitry 88 may provide or receive signals that pass through the MEMS switch 22 when the MEMS switch 22 is actuated, or drive the actuator plate 44 to control operation of the MEMS switch 22. In another embodiment, electronic circuitry 88 can be formed above the MEMS switch 22 to form interconnects and/or control the MEMS switch.

Figure 19:
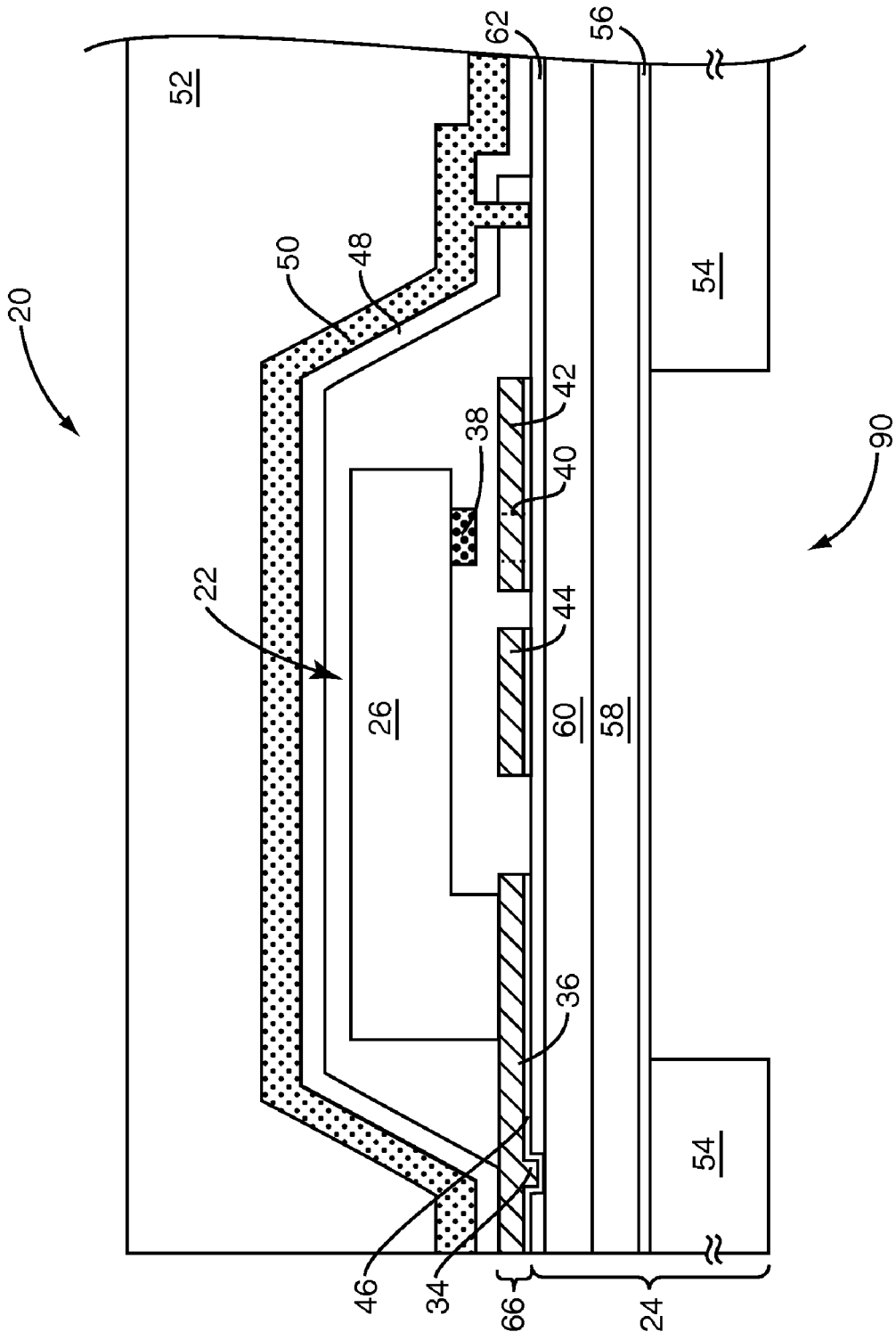
FIG. 19 is a block representation of a third embodiment of the MEMS switch integrated into the semiconductor device.

With reference to FIG. 19, all or a portion of the semiconductor substrate 24 that resides underneath the MEMS switch 22 may be removed to improve performance of the MEMS switch 22. As illustrated, a cored portion 90 is removed from the handle wafer 54 beneath the MEMS switch 22. The insulator layer 56 remains intact in this example; however, those skilled in the art will recognize that a portion of the handle wafer 54 may also remain intact underneath the MEMS switch 22. Alternatively, all or a portion of the insulator layer 56, and perhaps the device layer 58, may be removed as part of the cored portion 90. The size and shape of the cored portion 90 may be varied to obtain certain performance criteria for the MEMS switch 22.

Figure 20:
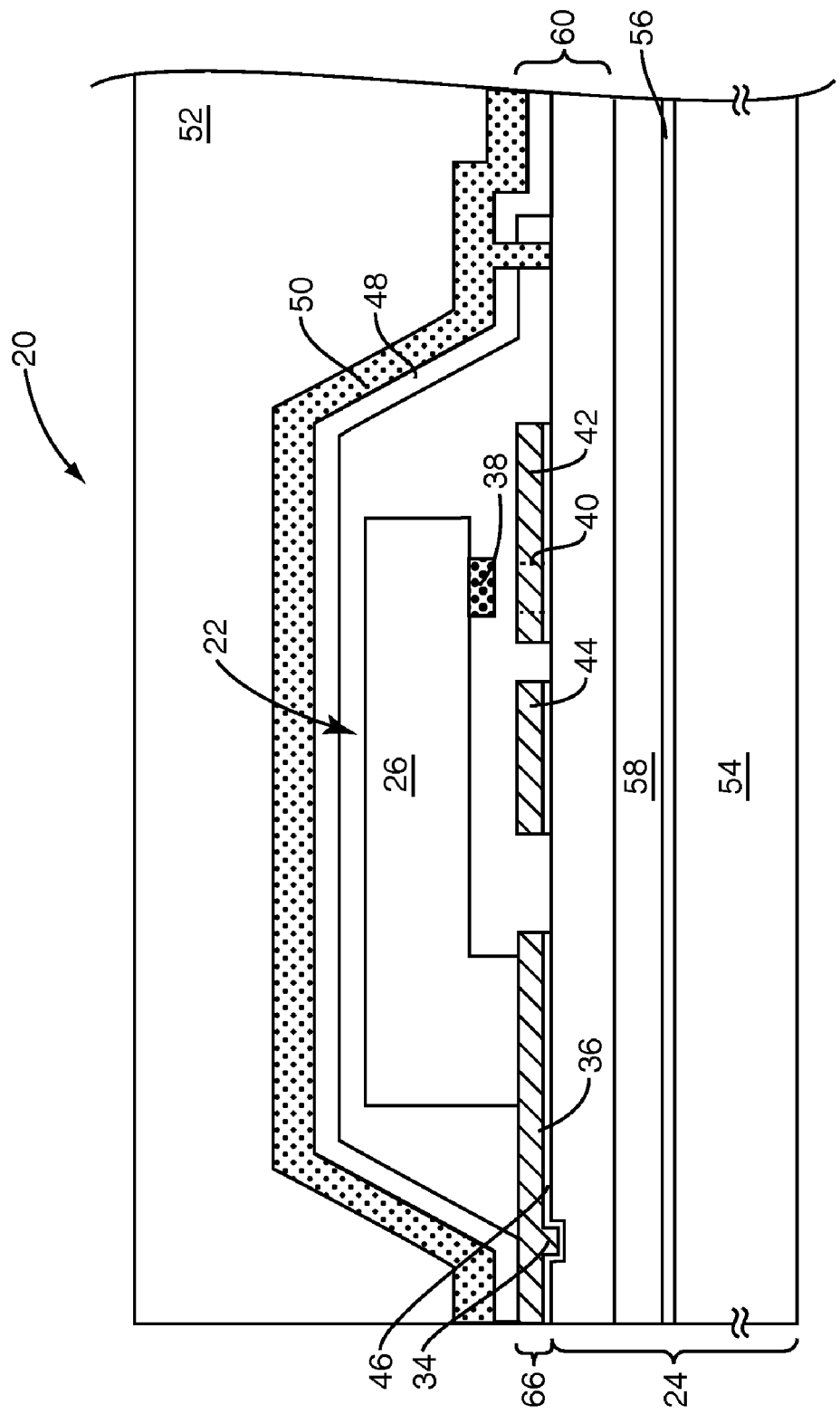
FIG. 20 is a block representation of a fourth embodiment of the MEMS switch integrated into the semiconductor device.

With reference to FIG. 20, the MEMS switch 22 may be formed directly on the metal-dielectric stack 60 prior to the passivation layer 62 being formed. As such, the first conductive pad 36, the second conductive pad 42, and the actuator plate 44 may be formed from the top metal layer that is part of the metal-dielectric stack 60, which is part of a standard CMOS process.

Figure 21:
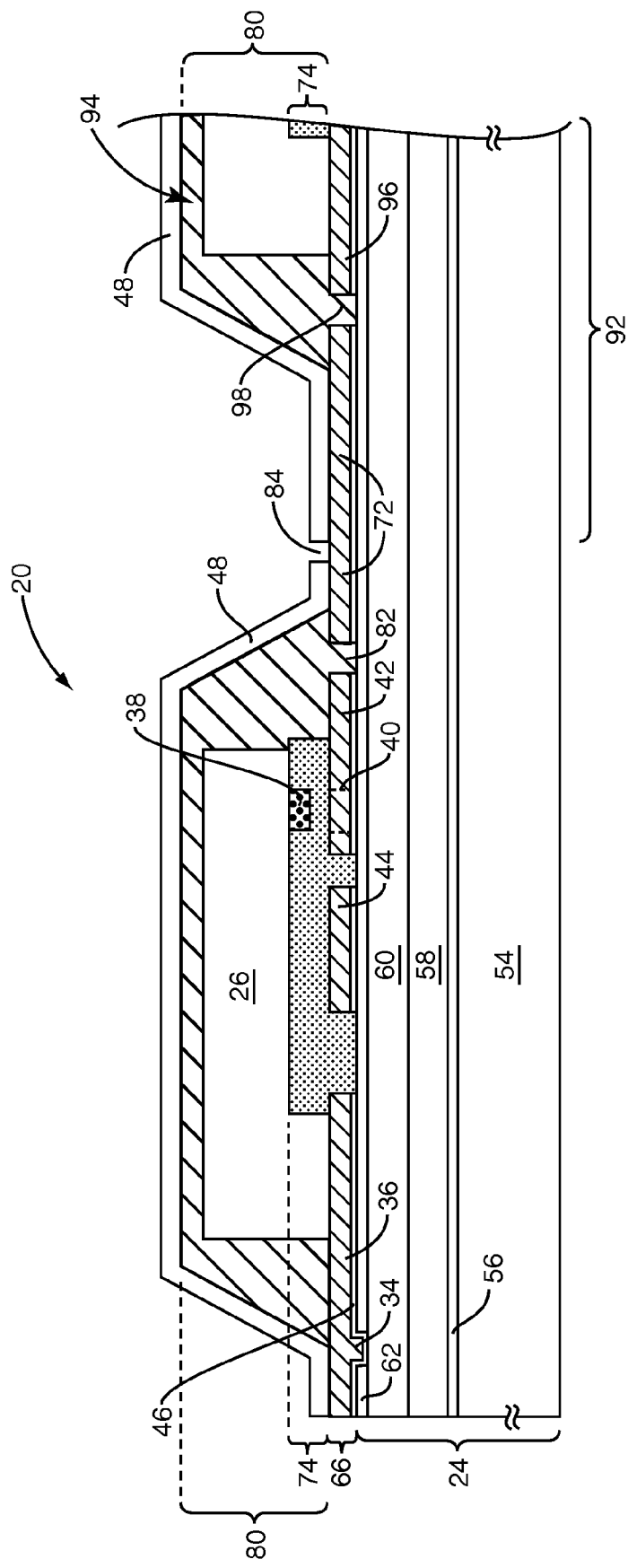
FIGS. 21-24 illustrate successive steps during the semiconductor fabrication process for constructing the semiconductor device having an integrated MEMS switch according to a further embodiment of the present invention.

In accordance with further embodiments of the present invention, a second semiconductor device 92, shown in FIG. 21, may be simultaneously formed with the semiconductor device 20, wherein the encapsulation layer opening 84 is used to etch sacrificial layers within the second conductor device 92.

In addition to the semiconductor device 20, the second semiconductor device 92 may be formed simultaneously during formation of the semiconductor device 20 such that the second semiconductor device 92 also includes a MEMS switch 94, which has a structure similar to that described above with reference to the MEMS switch 22 of the semiconductor device 20. Furthermore, in accordance with an embodiment of the present invention, the MEMS switch 94 may be formed using a process similar to that used to form the MEMS switch 22 of the semiconductor device 20 where the MEMS switch 94 is encapsulated by the first encapsulation layer 48.

As shown in FIG. 21, in this embodiment, the second semiconductor device 92 includes a first conductive pad 96 which is similar to, and formed in conjunction with, the first conductive pad 36 of the semiconductor device 20. As may be seen with reference to FIG. 21, the sacrificial conductive pad 72 extends between the semiconductor device 20 and the second semiconductor device 92. The second sacrificial layer 80 in the semiconductor device 92 forms an etch stop 98 between the sacrificial conductive pad 72 and the first conductive pad 96. Therefore, during etching of the sacrificial conductive pad 72 using the encapsulation layer opening 84, the etch stop 98 prevents etching of the first conductive pad 96, as more clearly shown in FIG. 22.

Figure 22:
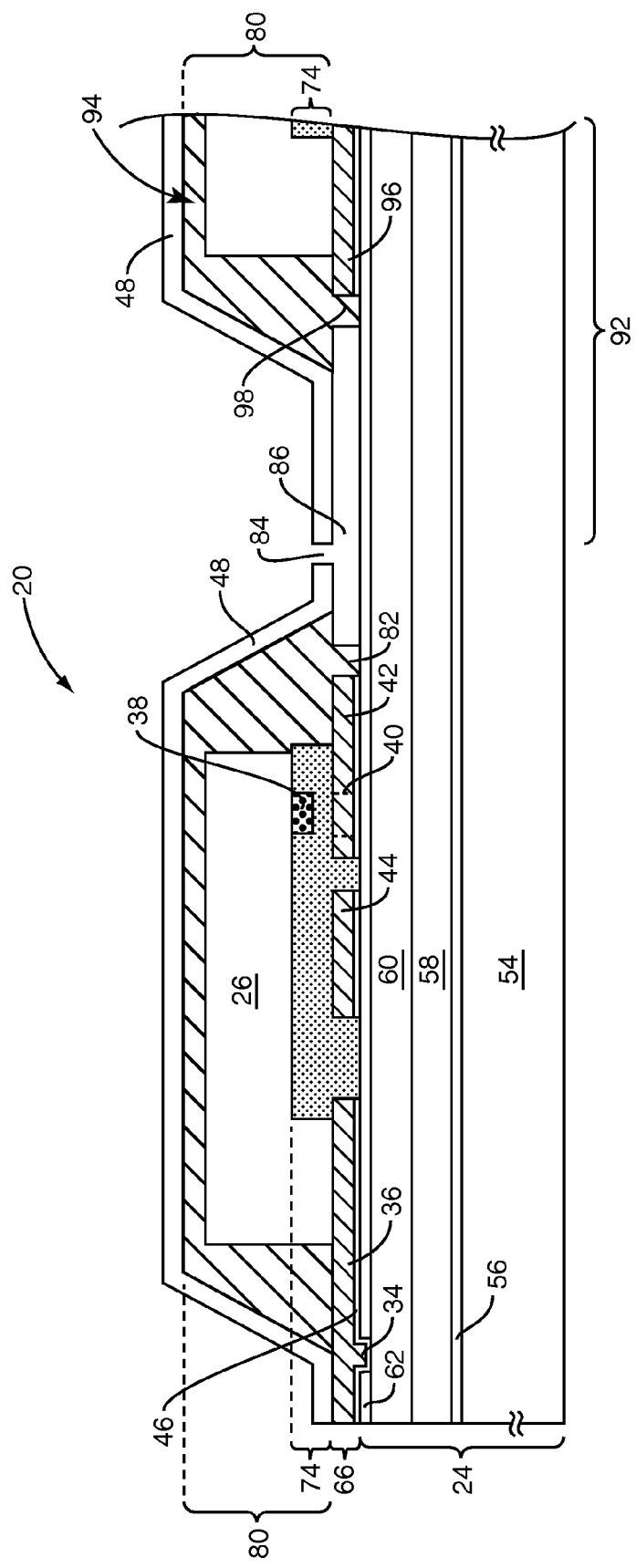
Figure 23:
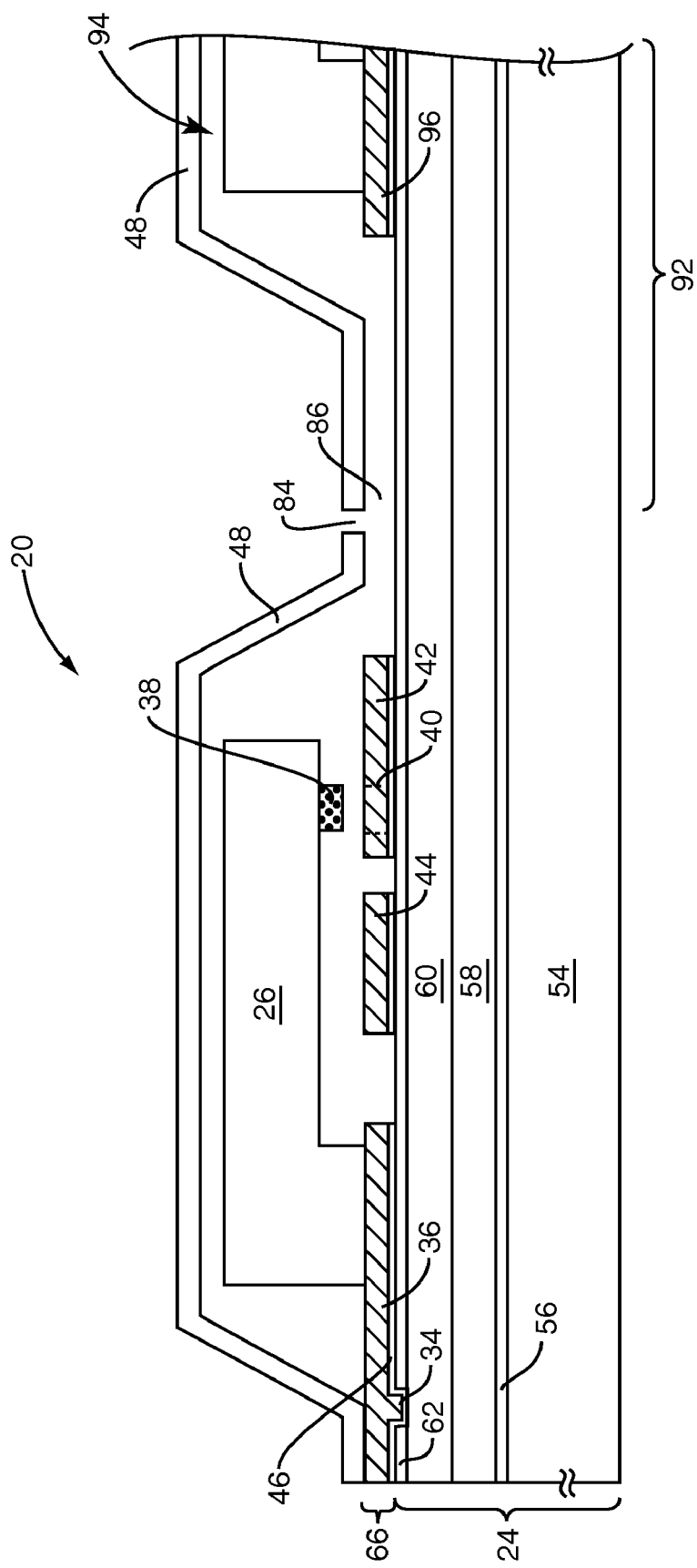
Figure 24:
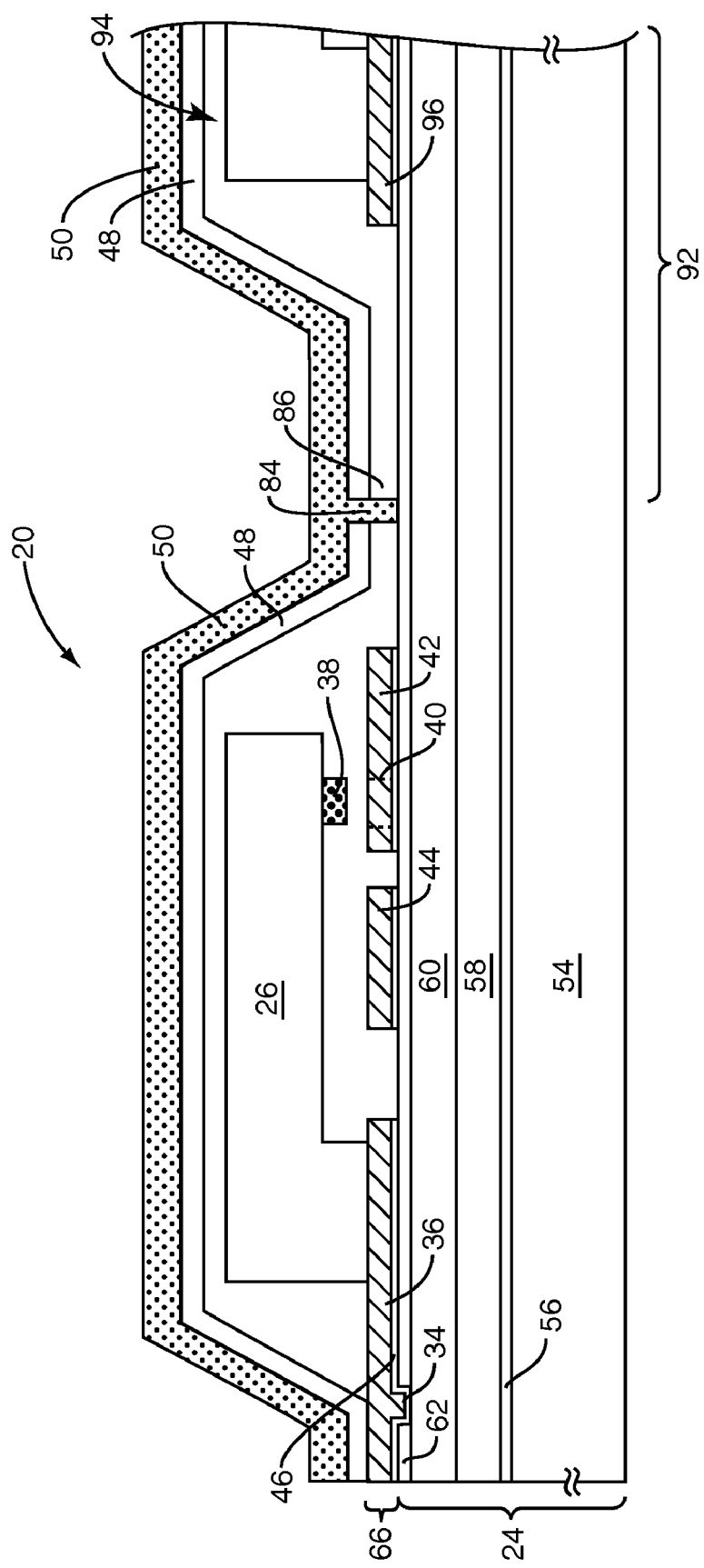

FIG. 22 shows the semiconductor device 20 and the second semiconductor device 92 after etching of the sacrificial conductive pad 72 where the tunnel 86 extends between both the semiconductor device 20 and the second semiconductor device 92. Therefore, the encapsulation layer opening 84 may be used to simultaneously etch the first and second sacrificial layers 74 and 80 disposed within the semiconductor device 20 and the second semiconductor device 92, as may be seen in FIG. 23. Once the first and second sacrificial layers 74 and 80 are simultaneously etched from the semiconductor device 20 and the second semiconductor device 92, the encapsulation layer 50 is formed over both devices, as may be seen in FIG. 24.

Those skilled in the art will recognize improvements and modifications to the preferred embodiments of the present invention. All such improvements and modifications are considered within the scope of the concepts disclosed herein and the claims that follow.

What is claimed is:

1. A device formed by a process comprising:
   providing a substrate having a component;
   forming a sacrificial layer over the component, the sacrificial layer including a cavity portion at least partially surrounding the component and a tunnel portion adjacent the cavity portion;
   forming an encapsulation layer having a cover portion and a perimeter portion over the sacrificial layer, wherein the cover portion encapsulates the cavity portion such that the cavity portion forms a cavity within the cover portion and the perimeter portion is disposed over the tunnel portion; and
   forming an access hole in the perimeter portion of the encapsulation layer, wherein the tunnel portion is formed from a different material than the cavity portion.

2. The device of claim 1, the process further comprising etching the tunnel portion via the access hole to form a tunnel extending to the cavity portion.

3. The device of claim 2, wherein the cavity portion forms an etch stop, such that the etch stop prevents etching of the component during etching of the tunnel portion.

4. The device of claim 2, wherein the tunnel portion comprises gold.

5. The device of claim 2, the process further comprising etching the cavity portion via the access hole and the tunnel.

6. The device of claim 1, the process further comprising etching the tunnel portion and the cavity portion via the access hole using a single etching process.

7. The device of claim 1, the process further comprising:
   etching the tunnel portion via the access hole with a first etchant during a first etching process to form a tunnel; and
   etching the cavity portion via the access hole and the tunnel with a second etchant during a second etching process, thereby forming the cavity.

8. The device of claim 1, wherein the cavity portion and the tunnel portion are formed from the same material such that an etchant used to remove the tunnel portion also removes the cavity portion.

9. The device of claim 1, wherein the access hole is formed over a portion of the tunnel portion.

10. The device of claim 1, wherein the access hole has a slit, circular, oval, rectangular, or polygonal configuration.

11. The device of claim 1, the process further comprising forming a second encapsulation layer over the encapsulation layer, wherein the second encapsulation layer fills the access hole.

12. The device of claim 1, further comprising forming a first layer over the substrate, wherein a first portion of the first layer forms a portion of the component.

13. The device of claim 12, wherein a second portion of the first layer forms the tunnel portion.

14. The device of claim 12, further comprising forming a second layer over the substrate, wherein a portion of the second layer forms the tunnel portion.

15. The device of claim 12, wherein the component is a Microelectromechanical Systems (MEMS) device and the first portion of the first layer forms a MEMS pad of the MEMS device.

16. The device of claim 12, wherein the first portion of the first layer forms a contact pad of the component.

17. The device of claim 2, wherein the tunnel portion includes a first layer and a second layer, where the first layer is etched to form the tunnel extending to the cavity portion.

18. A device comprising:
   a substrate having a component positioned thereon;
   an encapsulation layer having a generally planar perimeter portion surrounding a raised, generally trapazoidally-shaped cover portion, the cover portion defining a cavity that surrounds the component, the perimeter portion defining a tunnel portion underneath the perimeter portion and fluidly connected to the cavity; and
   an access hole in the perimeter portion of the encapsulation layer wherein the tunnel portion is formed from a different material than the cover portion.

19. The device of claim 18 wherein the access hole has a slit, circular, oval, rectangular, or polygonal configuration.

20. The device of claim 18 further comprising a second encapsulation layer, a portion of the second encapsulation layer sealing the access hole.

21. The device of claim 18 wherein the component is a microelectromechanical systems (MEMS) device.

22. The device of claim 18 wherein the component is a surface acoustic wave (SAW) filter.

* * * * *